United States Patent [19]

Kawano et al.

[11] Patent Number: 5,841,792
[45] Date of Patent: Nov. 24, 1998

[54] PROCESSING SYSTEM HAVING A TESTING MECHANISM

[75] Inventors: Kayoko Kawano; Yasushi Takaki, both of Kawasaki, Japan

[73] Assignee: Fujitsu Limited, Kawasaki, Japan

[21] Appl. No.: 718,872

[22] Filed: Sep. 24, 1996

[30] Foreign Application Priority Data

Oct. 6, 1995 [JP] Japan .................................... 7-260541
May 22, 1996 [JP] Japan .................................... 8-127434

[51] Int. Cl.⁶ .................................................... G01R 31/28
[52] U.S. Cl. ......................................... 371/22.5; 385/183.06
[58] Field of Search .............................. 371/22.31, 22.32, 371/22.34, 22.5, 25.1, 27.5, 22.6; 395/183.06, 183.01, 183.07, 183.19; 364/579, 580, 489, 550; 324/765, 76.11; 365/201

[56] References Cited

U.S. PATENT DOCUMENTS

| | | | |
|---|---|---|---|
| 5,056,093 | 10/1991 | Whetsel | 371/22.3 |
| 5,428,626 | 6/1995 | Frisch et al. | 371/27 |
| 5,448,576 | 9/1995 | Russell | 371/22.3 |
| 5,477,493 | 12/1995 | Danbayashi | 365/201 |
| 5,497,379 | 3/1996 | Whetsel | 371/22.3 |
| 5,606,566 | 2/1997 | Whetsel | 371/22.3 |
| 5,608,736 | 3/1997 | Bradford et al. | 371/22.3 |
| 5,627,840 | 5/1997 | Hundertmark et al. | 371/22.3 |
| 5,677,915 | 10/1997 | Whetsel | 371/22.3 |

FOREIGN PATENT DOCUMENTS

| | | |
|---|---|---|
| 60-243578 | 12/1985 | Japan . |
| 4-259866 | 9/1992 | Japan . |
| 6-201797 | 7/1994 | Japan . |

*Primary Examiner*—Albert Décady
*Assistant Examiner*—Nadeem Iqbal
*Attorney, Agent, or Firm*—Staas & Halsey

[57] ABSTRACT

In a processing system having a testing mechanism for implementing a test on a high density packaging printed circuit board, a data storing unit has an object chip component set unit in which information as to at least one object chip component is set in order to designate the object chip component, a data storage for object chip component for holding therein data that should be written into a register of the object chip component, and a data control unit for writing data held in the data storage for object chip component into the register of the object chip component set in the object chip component set unit in a shifting operation, whereby predetermined data may be written in a register in the testing mechanism without causing an increase of the number of registers for setting data or a storage region used to set data therein so as to simplify a system structure or improve an efficiency of a data setting process.

12 Claims, 21 Drawing Sheets

FIG. 6

| State | | Count | |
|---|---|---|---|
| S01 | TEST-LOGIC-RESET | | |
| | RUN-TEST/IDLE | | |
| | SELECT-DR-SCAN | | |
| | SELECT-IR-SCAN | | |
| S05 | CAPTURE-IR | | |
| | SHIFT-IR (8 BITS) | | |
| | EXIT1-IR | COUNT VALUE = 1 | CONTINUE |
| | PAUSE-IR | | |
| | EXIT2-IR | | |
| S10 | SHIFT-IR (8 BITS) | | |
| | EXIT1-IR | COUNT VALUE = 2 | CONTINUE |
| | PAUSE-IR | | |
| | EXIT2-IR | | |
| S15 | SHIFT-IR (8 BITS) | | |
| | EXIT1-IR | COUNT VALUE = 3 | CONTINUE |
| | PAUSE-IR | | |
| | EXIT2-IR | | |
| | SHIFT-IR (8 BITS) | | |
| | EXIT1-IR | COUNT VALUE = 4 | END |
| S20 | UPDATE-IR | | |
| | SELECT-DR-SCAN | | |
| | CAPTURE-DR | | |
| | SHIFT-DR (8 BITS) | | |
| | EXIT1-DR | COUNT VALUE = 1 | CONTINUE |
| S25 | PAUSE-DR | | |
| | EXIT2-DR | | |
| | SHIFT-DR (8 BITS) | | |
| | EXIT1-DR | COUNT VALUE = 2 | CONTINUE |
| | PAUSE-DR | | |
| S30 | EXIT2-DR | | |
| | SHIFT-DR (8 BITS) | | |
| | EXIT1-DR | COUNT VALUE = 3 | CONTINUE |
| | PAUSE-DR | | |
| | EXIT2-DR | | |
| S35 | SHIFT-DR (8 BITS) | | |
| | EXIT1-DR | COUNT VALUE = 4 | END |
| | UPDATE-DR | | |

IR SET: SET "JIR SET" IN THE INSTRUCTION REGISTER (IR) — brackets S05–S20

JIR SET: SET JTAG COMMAND IN JIR — brackets S20–S35

FIG. 7

| | | | |
|---|---|---|---|
| S38 | SELECT-DR-SCAN | | |
| S40 | SELECT-IR-SCAN | | |
| | CAPTURE-IR | | |
| | SHIFT-IR (8 BITS) | COUNT VALUE = 1 | CONTINUE |
| | EXIT1-IR | | |
| | PAUSE-IR | | |
| | EXIT2-IR | | |
| S45 | SHIFT-IR (8 BITS) | COUNT VALUE = 2 | CONTINUE |
| | EXIT1-IR | | |
| | PAUSE-IR | | |
| | EXIT2-IR | | |
| | SHIFT-IR (8 BITS) | COUNT VALUE = 3 | CONTINUE |
| S50 | EXIT1-IR | | |
| | PAUSE-IR | | |
| | EXIT2-IR | | |
| | SHIFT-IR (8 BITS) | COUNT VALUE = 4 | END |
| | EXIT1-IR | | |
| S55 | UPDATE-IR | | |
| | SELECT-DR-SCAN | | |
| | CAPTURE-DR | | |
| | SHIFT-DR (32 BITS) | COUNT VALUE = 1 | CONTINUE |
| | EXIT1-DR | | |
| S60 | PAUSE-DR | | |
| | EXIT2-DR | | |
| | SHIFT-DR | COUNT VALUE = 2 | CONTINUE |
| | EXIT1-DR | | |
| | PAUSE-DR | | |
| S65 | EXIT2-DR | | |
| | SHIFT-DR | COUNT VALUE = 3 | END |
| | EXIT1-DR | | |
| | UPDATE-DR | LOAD OPSR OF THE OBJECT REGISTER WITH "FFFFFFFF" | |
| | RUN-TEST/IDLE | | |

IR SET: SET "JDR SET" IN THE INSTRUCTION REGISTER

JDR SET: SET LOAD JDR WITH DATA

FIG. 9

| | | | |
|---|---|---|---|
| S101 | TEST-LOGIC-RESET | | |
| | RUN-TEST/IDLE | | |
| | SELECT-DR-SCAN | | |
| | SELECT-IR-SCAN | | |
| | CAPTURE-IR | | |
| S105 | SHIFT-IR (8 BITS) | COUNT VALUE = 1 | CONTINUE |
| | EXIT1-IR | | |
| | PAUSE-IR | | |
| | EXIT2-IR | | |
| S110 | SHIFT-IR (8 BITS) | COUNT VALUE = 2 | CONTINUE |
| | EXIT1-IR | | |
| | PAUSE-IR | | |
| | EXIT2-IR | | |
| S115 | SHIFT-IR (8 BITS) | COUNT VALUE = 3 | CONTINUE |
| | EXIT1-IR | | |
| | PAUSE-IR | | |
| | EXIT2-IR | | |
| S120 | SHIFT-IR (8 BITS) | COUNT VALUE = 4 | END |
| | EXIT1-IR | | |
| | UPDATE-IR | | |
| | SELECT-DR-SCAN | | |
| | CAPTURE-DR | | |
| S125 | SHIFT-DR (8 BITS) | COUNT VALUE = 1 | CONTINUE |
| | EXIT1-DR | | |
| | PAUSE-DR | | |
| | EXIT2-DR | | |
| S130 | SHIFT-DR (8 BITS) | COUNT VALUE = 2 | CONTINUE |
| | EXIT1-DR | | |
| | PAUSE-DR | | |
| | EXIT2-DR | | |
| S135 | SHIFT-DR (8 BITS) | COUNT VALUE = 3 | CONTINUE |
| | EXIT1-DR | | |
| | PAUSE-DR | | |
| | EXIT2-DR | | |
| | SHIFT-DR (8 BITS) | COUNT VALUE = 4 | END |
| | EXIT1-DR | | |
| | UPDATE-DR | | |

IR SET
SET "JIR SET" IN THE INSTRUCTION REGISTER (IR)

JIR SET
SET JTAG COMMAND IN JIR

FIG. 10

| | | | |
|---|---|---|---|
| S138 | SELECT-DR-SCAN | | |
| S140 | SELECT-IR-SCAN | | |
| | CAPTURE-IR | | |
| | SHIFT-IR (8 BITS) | COUNT VALUE = 1 | CONTINUE |
| | EXIT1-IR | | |
| | PAUSE-IR | | |
| | EXIT2-IR | | |
| S145 | SHIFT-IR (8 BITS) | COUNT VALUE = 2 | CONTINUE |
| | EXIT1-IR | | |
| | PAUSE-IR | | |
| | EXIT2-IR | | |
| S150 | SHIFT-IR (8 BITS) | COUNT VALUE = 3 | CONTINUE |
| | EXIT1-IR | | |
| | PAUSE-IR | | |
| | EXIT2-IR | | |
| | SHIFT-IR (8 BITS) | COUNT VALUE = 4 | END |
| | EXIT1-IR | | |
| S155 | UPDATE-IR | | |
| | SELECT-DR-SCAN | | |
| | CAPTURE-DR | | |
| | SHIFT-DR (32 BITS) | | |
| S160 | EXIT1-DR | COUNT VALUE = 1 | CONTINUE |
| | PAUSE-DR | | |
| | EXIT2-DR | | |
| | SHIFT-DR | | |
| | EXIT1-DR | COUNT VALUE = 2 | END |
| S165 | UPDATE-DR | | |
| | RUN-TEST/IDLE | | |

IR SET
SET "JDR SET" IN THE INSTRUCTION REGISTER

JDR SET
STORE OPSR DATA IN JDR AND SHIFT IT TO A DATA REGISTER OF SCI

PROCESSING SYSTEM HAVING A TESTING MECHANISM

BACKGROUND OF THE INVENTION

The present invention relates to a processing system having a testing mechanism (a JTAG circuit which is a boundary scan architecture, for example) used to test a high density packaging printed circuit board. In particular, the present invention relates to a technique suitable for use when data loading or data sensing is implemented during a test or an operation of the system using the testing mechanism.

High integration of chip components, such as LSIs, permits a more complicated circuit to be mounted on a chip having a smaller size in recent years. In addition, a surface packaging technique for a printed circuit board is improved so as to allow a larger number of chip components to be packaged on a printed circuit board. For this, it is possible to configure a system having a small size and a high performance. On the other hand, a test on each chip component on a printed circuit board becomes more difficult.

For a test on a high density packaging printed circuit board, a board testing procedure (a testability procedure) as a standard specification of IEEE standard 1149.1 has been proposed by JTAG (Joint Test Action Group). The board testing procedure defines a boundary scan architecture (hereinafter called a JTAG circuit) as a testing mechanism incorporated inside a chip component such as an LSI.

In the JTAG circuit (occasionally called a JTAG scan circuit), a scan chain of a shift type is provided to an input/output pin of each chip component mounted on a printed circuit board, and the scan chain of each chip component is connected with the scan chain of another chip component on the printed circuit board so as to control and observe a state of the input/output pin with only a scan shift operation without directly probing the input/output pin of each component on the printed circuit board.

Now, an example of a structure of a general JTAG circuit will be described with reference to FIG. 17. The JTAG circuit shown in FIG. 17 has five tap access ports (hereinafter, abbreviated as TAPs) 501–505, which will be described later, a tap controller 51, a data register group 52, an instruction register (IR) 53, a data register selector 54, an output side selecting circuit 55 and a gate circuit 56.

The TAP 501 is served to input a test clock signal TCK. The TAP 502 is served to input a test mode select signal TMS. The TAP 503 is served to input data necessary for a test. Hereinafter, the TAP 503 will be expressed as a test data input TDI. The TAP 504 is served to output a result of a test made on an LSI (a chip component) provided with the JTAG circuit. Hereinafter, the TAP 504 is expressed as a test data output TDO. Further, the TAP 505 is served to input a test reset signal TRST used to initialize a test logic within the JTAG circuit.

The TAP controller 51 controls a shifting operation to input input data from the test data input TDI to the instruction register 53 or to the data register group 52 using the test mode select signal TMS and the test clock signal TCK. The TAP controller 51 also controls a register selecting operation by the output side selecting circuit 55 or a switching operation of the gate circuit 56.

The data register group 52 is configured with a user test data register 520, a boundary scan register 521 and a bypass register 522.

The user test data register 520 is served to store therein arbitrary test data individually set by the user, which is configured with a shift register.

The boundary scan register 521 is configured with a one-stage shift register arranged at each terminal of a component to be tested (an LSI, here), which is served to capture or hold a signal appearing at the terminal of the LSI on a principle of the scan test.

The bypass register 522 is configured with a one-stage shift register, which can bypass between the test data input TDI and the output side selecting circuit 55 in order to output input data supplied from the test data input TDI from the test data output TDO via the output side selecting circuit 55 and the gate circuit 56 as it is. Therefore, the bypass register 522 is used when data is bypassed from this JTAG circuit to another JTAG circuit in the following stage.

The instruction register 53 is written therein a command (a register designate command) in a shifting operation.

The data register selector (a data register selecting unit) 54 analyzes a command written in the instruction register 53, and selects a register designated by the command in the data register group 52. The register selected by the data register selector 54 is written therein data in the shifting operation. If either the register 521 or the register 520 is selected, a data writing is implemented. If the bypass register 522 is selected, a bypass operation through the bypass register 522 is implemented.

The output side selecting circuit (an output data selecting unit) 55 is configured with multiplexers (MUXs) 551 and 552.

The multiplexer 551 is switched and controlled by the TAP controller 51 to select any register among the registers 520 through 522 in the data register group 52, and outputs data of the selected register 520, 521 or 522.

The multiplexer 552 is switched and controlled by the TAP controller 51 to select either data from the data register group 52 (an output of the multiplexer 551) or data from the instruction register 53, and outputs it.

An open/close state of the gate circuit 56 is controlled by the TAP controller 51 to output data from the output side selecting unit 55 (data from the multiplexer 552) to the test data output TDO when opened.

The JTAG circuit with the above structure is, in general, used to test a printed circuit board including a chip component in which the JTAG circuit is incorporated and the like. With the JTAG circuit, during a test or a normal operation, data is set in a circuit such as a register in a system logical circuit (data loading), or data is read out from a circuit such as a register in the system logical circuit (data sensing) in recent years. An access command issued to the system logical circuit with the JTAG circuit is called a JTAG command.

The JTAG circuit implementing data loading or data sensing with the JTAG command has, instead of the user test data register 520 shown in FIG. 17, a JTAG instruction register (hereinafter, abbreviated as a JIR) 523 and a JTAG data register (hereinafter, abbreviated as a JDR) 524 as shown in FIG. 18, for example.

The JIR 523 is served to store therein a command to control the system logical circuit in this LSI, which is configured with a shift register (or a shift register and a latch circuit). The JIR 523 is successively inputted thereto input data from the test data input TDI. When a predetermined command is set in the JIR 523, the command in the JIR 523 is transferred to a command analyzing unit within a command control unit (not shown), and analyzed in the command analyzing unit.

The JDR 524 is served to store therein data to be written in the system logic circuit within this LSI or data read out from the system logical circuit within this LSI, which is configured with a shift register (or a shift register and a latch circuit) similarly to the JIR 523.

If data is written in the JDR 524, input data from the test data input TDI is successively inputted and shifted. When predetermined data is set in the JDR 524, the data in the JDR 524 is transferred to an execution processing unit in the above command control unit, then a process is performed by the above command analyzing unit with the data on the basis of a result of the analysis. For instance, it is possible to set data in a register in the system logical circuit in which a normal operation is implemented, set a specific value in a counter, or reset only a specific circuit within this LSI.

Conversely, it is possible to read out data in the system logical circuit in which a normal operation is implemented from the test data output TDO via the JDR 524. Namely, data set in the register in the system logical circuit is transferred to the JDR 524, and contents in the JDR 524 are successively shifted, whereby the data is outputted from the test data output TDO.

Data writing in the JIR 523 or the JDR 524 is implemented in the shifting operation if the data register selector 54 selects the JIR 523 or the JDR 524 as stated above.

Next, an operation of the JTAG circuit (an executing operation of the JTAG command) having the JIR 523 and the JDR 524 as shown in FIG. 18 will be described with reference to FIG. 19. FIG. 19 is a flowchart showing state transition of a test logic. The state transition of the test logic is controlled by the TAP controller 51 so that various test states are realized. The TAP controller 51 is controlled by the test clock signal TCK, the test mode select signal TMS and the test reset signal TRST inputted from the TAPs 501, 502 and 505, respectively.

Immediately after the TAP controller 51 has been initialized, the JTAG circuit is in a TEST-LOGIC-RESET state (S201). In this state, a test logic is unusable and a system logic is in a normal operable state.

Each of the states transits according to a state of a test mode select signal TMS at a rise of the test clock signal TCK. For instance, in the TEST-LOGIC-RESET state (S201), a test clock signal TCK rises. If the test mode select signal TMS is "0" at that time, the state transits to a RUN-TEST/IDLE state (S202). If the test mode select signal TMS is "1", the TEST-LOGIC-RESET state (S201) is held.

The RUN-TEST/IDLE state (S202) is a basic state while the test is executed, which is a state in which a scanning operation is going to be implemented or an intermediate state during the scan operation.

When the state transits to a SELECT-DR-SCAN state (S203), a scan sequence is initialized.

Next, the state transits to a CAPTURE-DR state (S211) or a SELECT-IR-SCAN state (S204) depending on a state of the test mode select signal TMS. Here, description will be made of a case where the state transits to the SELECT-IR-SCAN state (S204) in order to implement a scanning operation on the instruction register 53. When the state transits to the SELECT-IR-SCAN state (S204), the scan sequence of the instruction register 53 is initialized.

When the state transits to a CAPTURE-IR state (S205), a fixed pattern is captured in a shift register constituting the instruction register 53. Lower two bits of the fixed pattern are fixed to a binary code "01", it is thereby possible to incorporate information unique to a design in this pattern. It is also possible to read contents of the instruction register 53 through the test data output TDO while a shifting operation is implemented.

Next, when the state transits to a SHIFT-IR state (S206), a shift register constituting the instruction register 53 is connected to the test data input TDI and the test data output TDO. Whenever the test clock signal TCK rises under a state in which the test mode selecting signal TMS is "0", data is shifted toward the test data output TDO side. If the instruction register 53 is of eight bits, a predetermined instruction can be written in the instruction register 53 by repeating the shifting operation eight times. It is also possible to read contents of the instruction register 53 by sending out data of the instruction register 53 to the test data output TDO while repeating the shifting operation.

When the shifting operation is completed, the state transits to an EXIT1-IR state (S207) to complete the scanning. If the test clock signal TCK is raised while the test mode selecting signal TMS is "0" in the EXIT1-IR state (S207), the state transits to a PAUSE-IR state (S208). If the test clock signal TCK is raised while the mode selecting signal TMS is "1", the state transits to an UPDATE-IR state (S210).

When the state transits to the PAUSE-IR state (S208), the shifting operation by the instruction register 53 on a serial path between the test data input TDI and the test data output TDO is paused. This state is used, for example, when a new pattern is loaded from an external storage apparatus into a storage of the testing mechanism.

If the test clock signal TCK is raised while the test mode selecting signal TMS is "1" under the PAUSE-IR state (S208), the state transits to an EXIT2-IR state (S209) in which the scanning is terminated. If a further scanning operation is required, the test mode selecting signal TMS is made "0" and the test clock signal TCK is raised in the EXIT2-IR state (S209), whereby the state again transits to the SHIFT-IR state (S206) to implement the shifting operation. If the scanning operation is intended to be terminated, the test mode select signal TMS is made "0" in the EXIT2-IR state (S209) so that the state transits to the next UPDATE-IR state (S210).

When the state transits to the UPDATE-IR state (S210), a new instruction shifted in a shift register is latched and outputted in parallel. When the latching is completed, the instruction is initiated to be executed.

For instance, when an instruction to bypass is loaded to the instruction register 53, the bypass register 522 is selected to be connected to the test data input TDI and the test data output TDO so that the bypassing operation is implemented by the shifting operation.

If an instruction of "JIR SET" or "JDR SET" is loaded in the instruction register 53, the JIR 523 or the JDR 524 is selected to be connected to the test data input TDI and the test data output TDO, whereby a data loading operation on the JIR 523 or the JDR 524 or a data sensing operation from the JIR 523 or the JDR 524, that is, the scanning operation, is implemented by the shifting operation.

On the other hand, states S203, and S211 through S216 shown in FIG. 19 show a case where the scanning operation is implemented on the boundary scan register 521, the bypass register 522, and the JIR 523 or the JDR 524.

As compared the scanning operation in these states S203 and S211 through S216 with the scanning operation on the instruction register 53 described as the states S204 through S210, they differ from each other in points that a register to be scanned is either the instruction register 53 or the four registers 521 through 524 belonging to the data register group 52, and that the number of times of shifting by the shifting operation is altered depending on which register among the registers 521 through 524 is selected as an object of the scanning.

However, the state transition is almost the same. The states S203 and S211 through S216 correspond to the states S204 through S210, respectively, detailed descriptions of which are thus omitted.

Incidentally, as a difference in inscription, "IR" meaning the instruction register 53 in the inscription of the states S204 through S210 becomes "DR" meaning the data register group 52 in the inscription of the states S203 and S211 through S216.

FIG. 20 shows a whole structure of a processing system in which the above-mentioned JTAG circuit in FIGS. 18 and 19 is provided to each chip component. The processing system has a service processor (hereinafter, abbreviated as SVP) 101, an interface circuit [hereinafter, abbreviated as SCI (System Console Interface)] 102 and a main apparatus 103.

The SVP 101 is connected to the main apparatus 103 via the SCI 102, which maintains the entire system and controls operations of the entire system. The SVP 101 issues control commands to control registers in each of printed circuit boards 103-1 through 103-m forming the main apparatus 103, to write data in a storage, to read data from the storage and the like.

A chip component such as an LSI mounted on each of the printed circuit boards 103-1 through 103-m is provided with the JTAG circuit described above with reference to FIG. 18. The SVP 101 also controls the JTAG circuit via the SCI 102. To this end, the SCI 102 is connected to each of the printed circuit boards 103-1 through 103-m within the main apparatus 103 over signal lines 104 used to transmit/receive various commands and data in order to control the JTAG circuit.

As shown in FIG. 21, LSI-1 through LSI-X within each of the printed circuit boards 103-1 through 103-m are provided with the respective JTAG circuits, as stated above. Incidentally, FIG. 21 schematically shows only essential parts [the instruction register 53, the JIR 523, the JDR 524, the data register selector (selecting circuit) 54 and the output side selecting circuit 55] of the JTAG circuit in each of the LSI-1 through LSI-X.

The test data output TDO of the JTAG circuit of each of the LSI-1 through LSI-X is connected to the test data input TDI of the JTAG circuit in another LSI within the same printed circuit board, whereby a scan chain making a round of the LSI-1 through LSI-X within each of the printed circuit boards is formed.

In the SCI 102, register groups 111, 112 and 113 for holding data (load data) that should be written in the registers 53, 523 and 524 in each of the LSI-1 through LSI-X within each of the printed circuit boards 103-1 through 103-m are provided for each of the registers 53, 523 and 524. In each of the register groups 111 through 113, shift registers 110-1 through 110-X corresponding to the respective LSI-1 through LSI-X are connected like a chain in the order similar to the order connecting the LSI-1 through LSI-X.

If data is written in any one among the instruction register 53, the JIR 523 and the JDR 524 within the JTAG circuit, predetermined data is set and stored in each of the shift registers 110-1 through 110-X of the register groups 111 through 113 by the SVP 101 (not shown in FIG. 21), then the selecting circuit 114 selects one corresponding to a register that is an object of the data writing among the register groups 111 through 113.

The data stored in the selected register group 111, 112 or 113 is successively sent out to the JTAG circuits of the LSI-1 through LSI-X over the signal line 104. By transferring the data in the shifting operation, the predetermined data is stored in any one among the instruction register 53, the JIR 523 and the JDR 524 of a corresponding LSI-1, LSI-2, . . . or LSI-X when the data stored in the register groups 111 through 113 is all sent out.

When data in any one among the instruction register 53, the JIR 523 and the JDR 524 in the JTAG circuit is read out, the selecting circuit 55 selects a register that is an object of the data reading. By transferring the data in the shifting operation, the data in the register that is an object of the data reading is read out, and transferred to the SCI 102 over the signal line 104. In the SCI 102, the selecting circuit 115 selects one among the register groups 111 through 113 corresponding to the register that is an object of the data reading, then successively stores the data transferred from the printed circuit board side in the shift registers 110-1 through 110-X within a predetermined register group 111, 112 or 113 while shifting the same.

As stated above, the register groups for the IR 111, the register group for the JIR 112 and the register group for the JIR 113 are provided on the SCI 102 side, besides the shift registers 110-1 through 110-X corresponding to the respective LSI-1 through LSI-X are provided for each of the register groups 111 through 113, whereby different data may be stored in JTAG related registers in each of the LSI-1 through LSI-X on each of the printed circuit board 103-1 through 103-m.

The technique described above with reference to FIG. 21 requires registers in number equal to the number of LSIs for each type of JTAG related registers in the SCI 102 (or ensure a storage region in a corresponding capacity) in order to store data different from LSI to LSI in the JTAG related registers (the IR, the JIR and the JDR).

Such structure does not cause a serious problem if the number of LSIs on each of the printed circuit boards 103-1 through 103-m constituting the main apparatus 103 is small. However, an increase in the number of LSIs with an increase in a degree of high-density packaging on each of the printed circuit boards 103-1 through 103-m leads to an increase of the number of the registers (or the storage region).

During a normal operation, there is a case where predetermined data is written in a register in the LSI on each of the printed circuit boards 103-1 through 103-m or data is read out from a predetermined register. However, if the number of registers increases as stated above, it is necessary to set data in all shift registers in the SCI 102 by the SVP 101 even if data is intended to be written in a part of the registers in the LSI, which increases a work of a data setting process by the SVP 101. If data is set in a register during the operation to implement another control, it is actually unnecessary to set different data in all LSIs. For this, the general data setting process needs unnecessary work.

SUMMARY OF THE INVENTION

In the light of the above problems, an object of the present invention is to provide a processing system having a testing mechanism which can write predetermined data in a register within the testing mechanism without causing an increase of the number of registers for data setting or a storage region for data setting so as to simplify a system structure and improve an efficiency of a data setting process.

The present invention therefore provides a processing system having a testing mechanism, the processing system further having at least one printed circuit board having plural chip components, in which the testing mechanism for implementing a board test is incorporated in each of the chip components of the printed circuit board, each of registers constituting the testing mechanism is connected like a chain with corresponding registers in the other chip components, a data storing unit for storing in advance therein data that should be written into each of the registers connected like a chain in a shifting operation is provided to the processing system, the processing system comprising the data storing unit comprising an object chip component set unit for being set therein information as to at least one object chip component in order to designate the object chip component having the register that should be written data therein, a data storage for object chip component for holding therein data that should be written in the register of the object chip component, and a data control unit for writing data held in the data storage for object chip component in the register of the object chip component set in the object chip component set unit in the shifting operation.

According to the processing system having the testing mechanism of this invention, it is possible to write predetermined data in a specific register only by setting information as to an object chip component in the object chip component set unit besides storing the data in the data storage for object chip component. Even if the number of the chip components increases, it is therefore possible to write predetermined data in a register within the testing mechanism without causing an increase of the number of registers for data setting or a storage region for data setting so that a system structure may be largely simplified and an efficiency of a data setting process may be largely improved.

BRIEF DESCRIPTION OF THE DRAWINGS

FIGS. 6 and 7 are diagrams showing state transition in loading data according to the example shown in FIG. 5;

FIGS. 9 and 10 are diagrams showing state transition in sensing data according to the example shown in FIG. 8;

DESCRIPTION OF THE PREFERRED EMBODIMENTS

Figure 1:
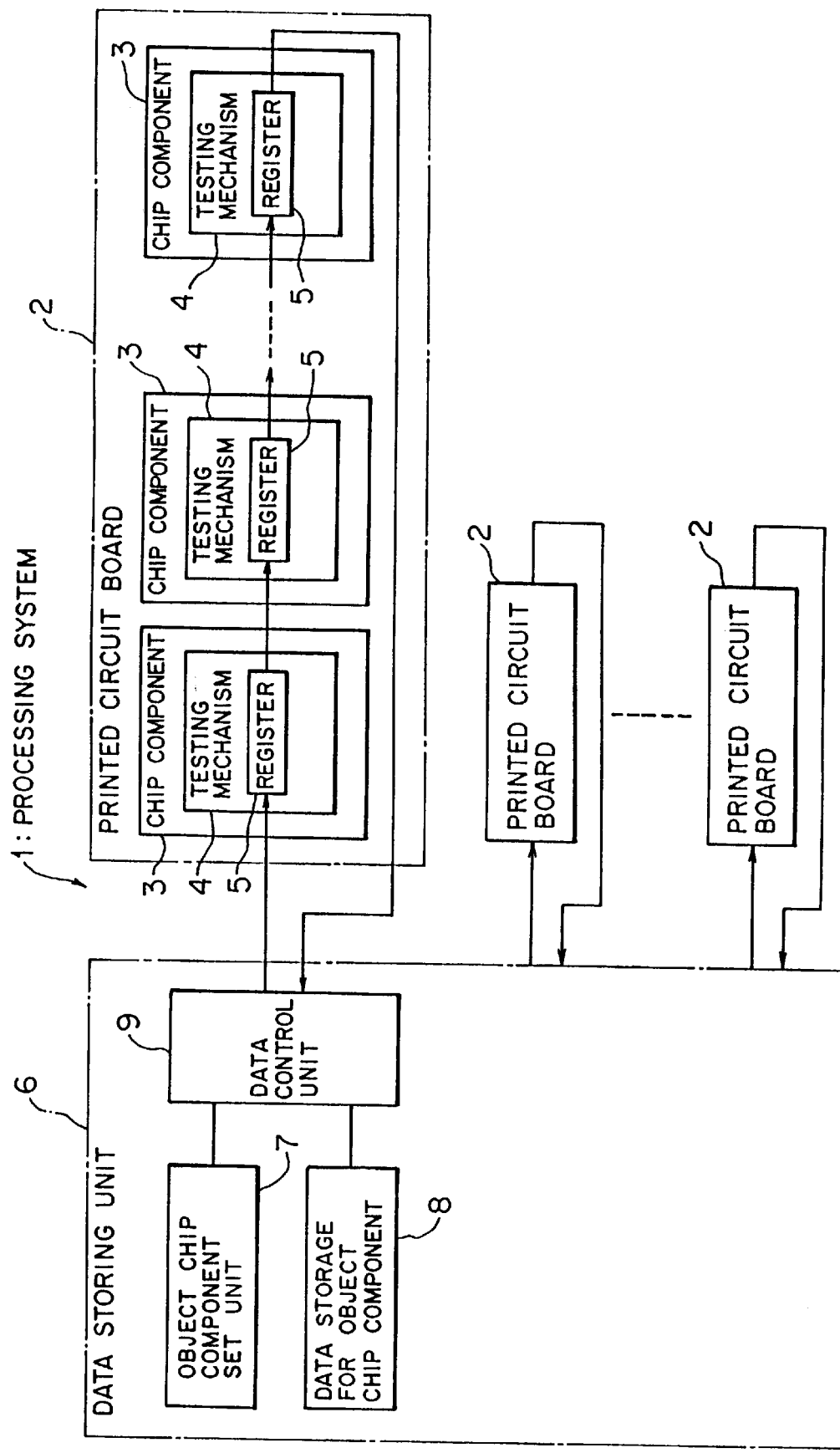
FIG. 1 is a block diagram showing an aspect of this invention.

(A) Description of an Aspect of the Invention

Now, an aspect of this invention will be described with reference to the drawing.

FIG. 1 is a block diagram showing the aspect of this invention. As shown in FIG. 1, a processing system 1 according to this invention has at least one printed circuit board 2 having plural chip components 3. A testing mechanism 4 for implementing a board test is incorporated in each of the chip components 3 of each printed circuit board 2.

Each of registers 5 configuring the testing mechanism 4 is connected like a chain with corresponding registers in the other chip components 3. A data storing unit 6 for storing therein in advance data that should be written into each of the registers 5 connected like a chain in the shifting operation is provided to the processing system 1.

The data storing unit 6 according to this invention is provided with an object chip component set unit 7, a data storage for object chip component 8 and a data control unit 9.

Here, the object chip component set unit 7 is set therein information as to at least one object chip component 3 in order to designate the object chip component 3 having the register 5 in which data should be written. The data storage for object chip component 8 holds herein data that should be written in the registers of the object chip component 3.

The data control unit 9 writes data held in the data storage for object chip component 8 into the register 5 of the object chip component 3 set in the object chip component set unit 7 in the shifting operation.

Only by setting information as to the chip component 3 having the register 5 that is required to be written data therein in the object chip component set unit 7, and storing data that should be written in that register 5 in the data storage for object chip component 8, it is possible to write predetermined data in a specific register 5. Therefore, it becomes unnecessary to prepare registers in number equal to the number of the chip components 3 (or a storage region in a corresponding capacity) in the data storing unit 6. In addition, it is possible to save labour for a data setting process.

If the testing mechanism 4 in each of the plural chip components 3 has as the register 5 what stores therein an instruction to be given to the testing mechanism 4 (an IR, for example) or what stores therein an instruction to be given to a system logical circuit of the chip component 3 (a JIR, for example), the data storing unit 6 may have a data storage for non-object chip component holding herein an instruction which will be written in the registers 5 of non-object chip components 3 excepting an object chip component to be able to nullify operations of the testing mechanisms 4 or the system logical circuits on the non-object chip components 3, besides the data control unit 9 may write the instruction held in the data storage for non-object chip components into the registers 5 of the non-object chip components 3 excepting the object chip component set in the object chip component set unit 7 in the shifting operation.

In which case, only by setting an instruction held in the data storage for non-object chip components in the registers 5, it is possible to nullify operations of the test mechanisms 4 or the system logical circuits on the non-object chip components 3. No matter what data are stored in registers for data, it is possible to nullify the data.

At this time, the data control unit 9 may stop the shifting operation when completing a writing of data held in the data storage for object chip component 8 into the register 5 on the object chip component 3 set in the object chip component set unit 7. Whereby, it is possible to shorten a time required to write data (data loading) in a specific register 5.

Further, the data control unit 9 may write data read out from the register 5 of the object chip component 3 set in the object chip component set unit 7 into the data storage for object chip component 8 in the shifting operation. In consequence, it is possible to read out data held in a specific register 5 only by setting information as to a chip component 3 having a register 5 from which data is required to be read out in the object chip component set unit 7.

At this time, the data control unit 9 may stop the shifting operation when completing a writing of data read out from the register 5 of the object chip component 3 set in the object chip component set unit 7 in the data storage for object chip component 8. It is thereby possible to shorten a time required to implement a data reading (data sensing) from a specific register 5.

Further, a serial number given to each of the chip components 3 connected like a chain on the printed circuit board 2 in the order connected are set as information used to designate the object chip component 3 in the object chip component set unit 7. At the same time, the data control unit 9 may have a counter which is counted up by one each time data is sent out to one chip component 3, and send out data held in the data storage for object chip component 8 in the shifting operation if a count value by the counter coincides with a serial number set in the object chip component set unit 7.

Incidentally, the testing mechanism 4 in each of the plural chip components 3 may be configured as a JTAG circuit which is a boundary scan architecture for implementing a board test.

In which case, the JTAG circuit has, as data registers, a boundary scan register for capturing and holding a signal appearing at each terminal of the chip component 3 in which the JTAG circuit is incorporated, a JTAG instruction register for storing therein an instruction to control the system logical circuit on the chip component 3 in which the JTAG circuit is incorporated, and a JTAG data register for storing therein data that should be written into the system logical circuit or data read out from the system logical circuit. The JTAG circuit further has an instruction register for storing therein an instruction to designate one register among these data registers, a data register selecting unit for selecting a register according to an instruction stored in the instruction register among the data registers, and an output data selecting unit for outputting data from a register selected by the data register selecting unit to the outside.

Each of the boundary scan registers, the JTAG instruction register, the JTAG data register and the instruction register is connect like a chain with corresponding registers in the other chip components 3 via the output data selecting unit. The data storing unit 6 has a data storage for object chip component 8 corresponding to each of the JTAG instruction register, the JTAG data register and the instruction register.

It is thereby possible to write predetermined data in a specific register among the JTAG instruction register, the JTAG data register and the instruction register within the JTAG circuit (the testing mechanism 4) on each of the chip components 3, as above. In consequence, it becomes unnecessary to prepare registers in number equal to the number of the chip components 3 for each type of the registers (or a storage region in a corresponding capacity) in the data storing unit 6. In addition, labour for a data setting process may be saved.

It is possible that the testing mechanism 4 in each of the plural chip components 3 has a bypassing mechanism for sending out data transferred from the testing mechanism 4 in the preceding chip component 3 to the testing mechanism 4 in the following chip component 3 in the shifting operation without passing through the register 5 so that each of the testing mechanisms 4 on the non-object chip components 3 excepting the object chip component sends out data transferred from the testing mechanism 4 in the preceding chip component 3 to the testing mechanism 4 in the following chip component 3 in the shifting operation without passing through the register 5.

By bypassing data from the testing mechanism 4 in the preceding chip component 3 and sending out the data to the testing mechanism 4 in the following chip component 3 by the bypassing mechanism on the non-object chip component 3 as above, it becomes unnecessary to shift the data on the register 5 so that a time required to implement data writing (data loading) in the register 5 on the object chip component 3 or data reading (data sensing) from the register 5 on the object chip component 3 may be shortened.

If the bypass mechanism as above is used, a resetting process is implemented on the registers 5 when the testing mechanism 4 in each of the plural chip components 3, besides an instruction to nullify an operation of the system logical operation on each of the non-object chip components 3 is set in a register in which the instruction to be given to the system logical circuit on the chip component 3 among the registers 5 in the resetting process.

When the bypassing mechanism on the non-object chip component 3 sends out data from the testing mechanism 4 in the preceding chip component 3 as it is to the testing mechanism 4 in the following chip component 3, an instruction to be able to nullify an operation of the system logical circuit is set in a predetermined register, whereby the instruction to be given to the system logical circuit issued immediately before remains to be held so as to prevent a command corresponding to the value from being accidentally activated.

If the bypassing mechanism as above is used, the testing mechanism 4 in each of the plural chip components 3 may be configured as a JTAG circuit as a boundary scan architecture for implementing a board test, similarly to the above example.

In which case, the JTAG circuit has, as a data register, a bypass register of one bit functioning as the bypassing mechanism in addition to the boundary scan register, the JTAG instruction register and the JTAG data register mentioned above. The JTAG circuit further has an instruction register in which an instruction to designate one register among these data registers, a data register selecting unit for selecting a register according to the instruction stored in the instruction register among the data registers, and an output data selecting unit for outputting data from a register selected by the data register selecting unit to the outside.

Each of the boundary scan registers, the JTAG instruction register, the JTAG data register, the bypass register and the instruction register is connected like a chain with corresponding registers in the other chip components 3 via the output data selecting unit. The data storing unit 6 has data storage for object chip component 8 corresponding to each of the JTAG instruction register, the JTAG data register and the instruction register.

It is thereby possible to write predetermined data into a specific register among the JTAG instruction register, the JTAG data register and the instruction register within the JTAG circuit (the testing mechanism 4) on each of the chip components 3 as above. In consequence, it becomes unnecessary to prepare registers in number equal to the number of the chip components 3 for each type of the registers (or a storage region in a corresponding capacity) in the data storing unit 6. In addition, labour for a data setting process may be saved.

On the non-object chip component 3, data from the testing mechanism 4 in the preceding chip component 3 is shifted by one bit so as to be sent out as it is to the testing mechanism 4 in the following chip component 3 via the bypass register. In consequence, it becomes unnecessary to shift the data on the data register so that a time required to implement data writing (data loading) in the JTAG data register on the object chip component 3 or data reading (data sensing) from the JTAG data register on the object chip component 3.

On the other hand, if the testing mechanism 4 is configured as the JTAG circuit as above and a predetermined instruction to be given to the system logical circuit is set in the JTAG instruction register and an access to the system logical circuit is executed via the JTAG data register by a direct memory access [hereinafter, occasionally called as DMA (Direct Memory Access)], the JTAG data register may repeatedly execute a data shifting operation according to the predetermined instruction the number of times of execution of the direct memory access in a state where the JTAG instruction register holds the predetermined instruction.

If the JTAG command is activated by DMA, it is possible to read data from the system logical circuit on the object chip component 3 or write data into the system logical circuit on the object chip component 3 in a short time without necessity to set the same instruction each occasion in the instruction register or the JTAG instruction register.

According to the processing system having the testing mechanism of this invention, it is possible to write predetermined data in a specific register 5 only by setting information as to the object chip component 3 in the object chip component set unit 7 and storing the data in the data storage for object chip component 8. It is therefore possible to write predetermined data in the register 5 within the testing mechanism 4 without causing an increase of the number of registers for data setting or a storage region for data setting if the number of the chip components 3 increases. As a result, the system structure may be largely simplified, and an efficiency of a data setting process may be largely improved.

Only by setting an instruction (a no operation instruction or the like) to be able to nullify an operation of the testing mechanism 4 or the system logical circuit on the non-object chip component 3 in the register for an instruction on the object chip component 3, it is possible to nullify data no matter what data is stored in the register for data. In which case, the shifting operation is stopped when data held in the data storage for object chip component 8 is completed to be written into the register 5 on the object chip component 3, whereby a time required to write data into a specific register 5 may be further shortened so as to contribute to an improvement in efficiency of a data setting process.

Further, only by setting information as to at least one object chip component 3 in the object chip component set unit 7, it is possible to read data held in a specific register 5. When data read out from the register 5 on the object chip component 3 is completed to be written into the data storage for object chip component 8, the shifting operation is stopped, whereby a time required to read data from the specific register 5 may be shortened, and an efficiency of a data reading process may thus be improved.

On the non-object chip component, data from the testing mechanism 4 in the preceding chip component 3 is sent out as it is to the testing mechanism in the following chip component 3 by the bypassing mechanism on the chip component 3 so that it becomes unnecessary to shift the data on the register 5. It is thereby possible to shorten a time required to write data into a register 5 on the object chip component 3 or read data from a register 5 on the object chip component 3, thus more improve an efficiency of a data writing process or a data reading process.

When the JTAG command is activated by DMA, the JTAG data register repeatedly executes a data shifting operation the number of times equal to the number of times of execution of the direct memory access while the JTAG instruction register keeps holding a predetermined instruction. It is thereby possible to read data from the system logical circuit on the object chip component 3 or write data into the system logical circuit on the object chip component 3 without necessity to set the same instruction each occasion in the instruction register or the JTAG instruction register so as to contribute to an improvement in efficiency of a data writing process or a data reading process.

(B) Description of an Embodiment of the Invention

Now, description will be made of an embodiment of this invention with reference to the drawings.

Figure 2:
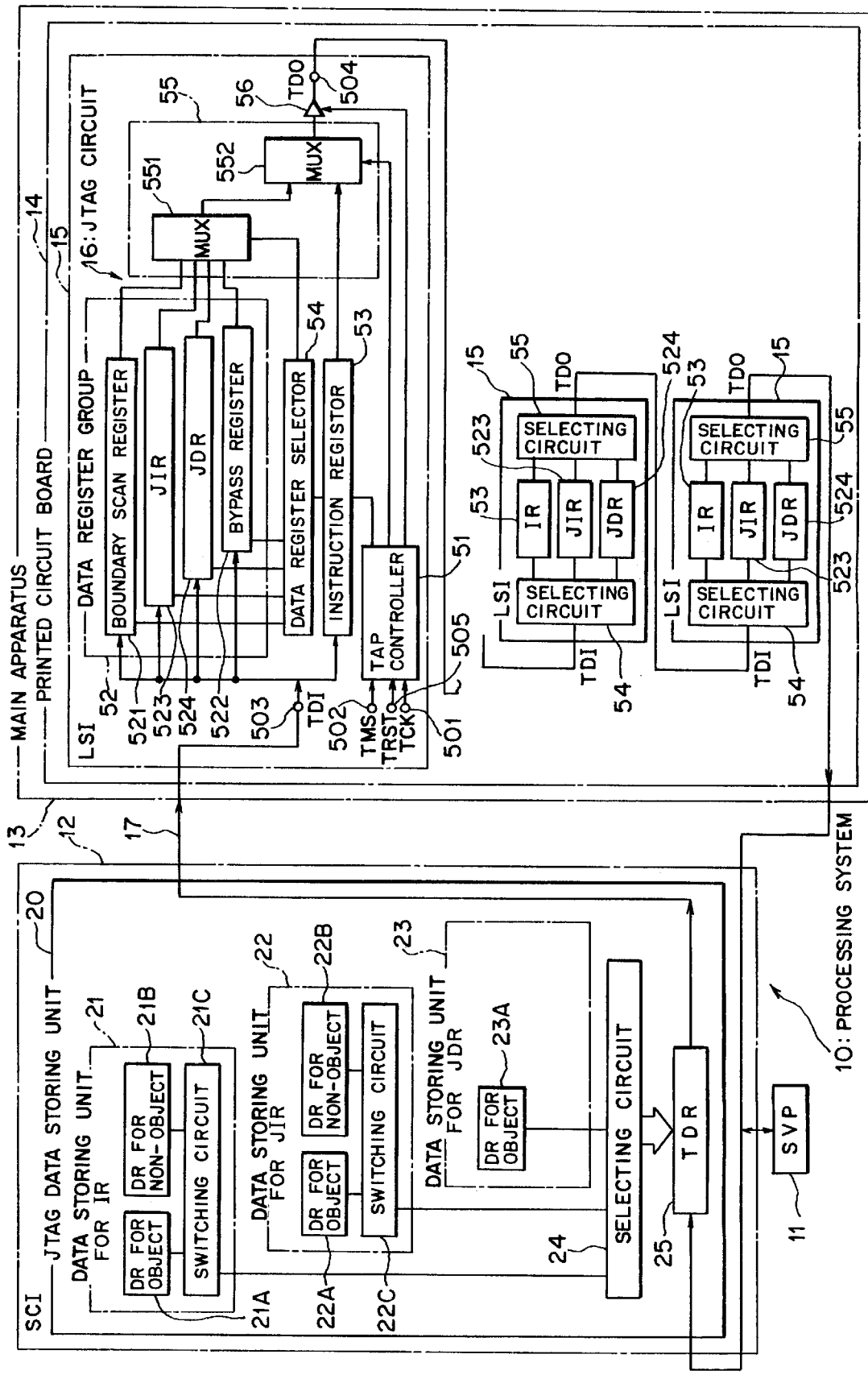
FIG. 2 is a block diagram showing a structure of a processing system having a testing mechanism (a JTAG circuit) according to an embodiment of this invention.
Figure 20:
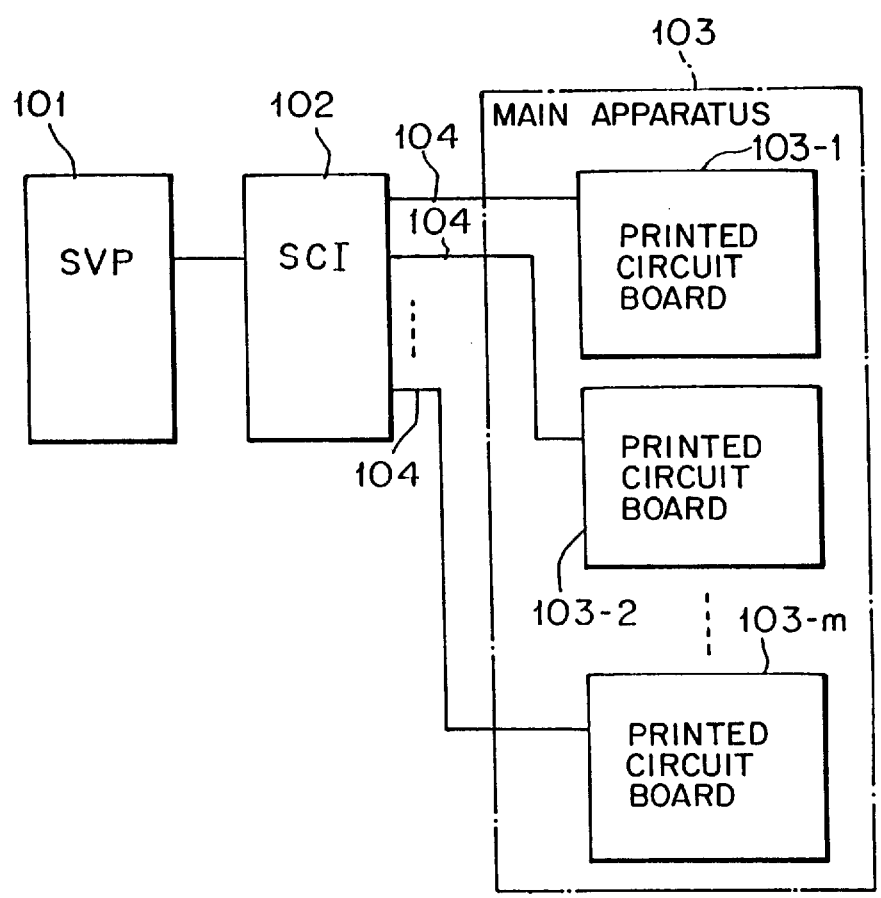
FIG. 20 is a block diagram showing an entire structure of a processing system having the JTAG circuit shown in FIG. 18.
Figure 21:
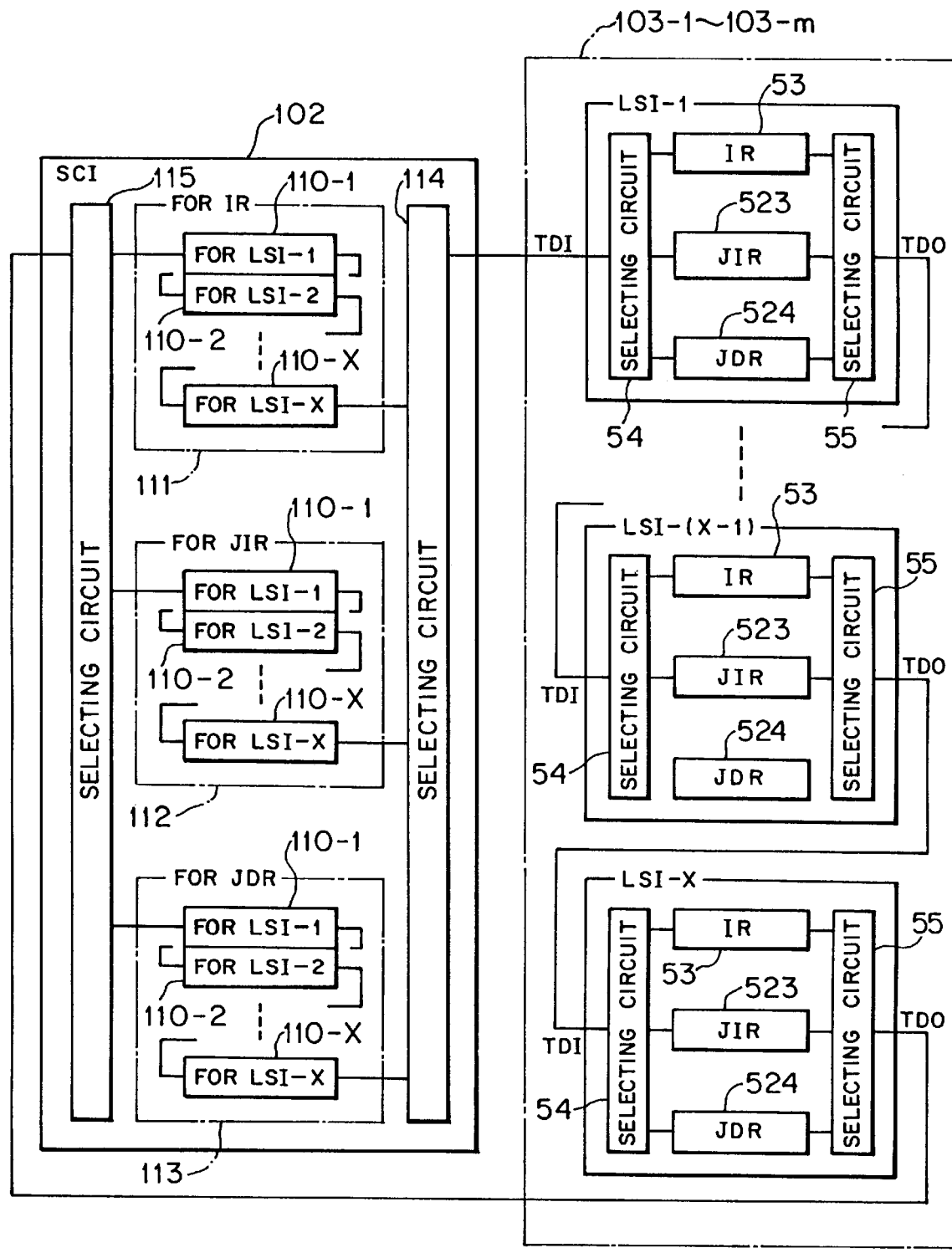
FIG. 21 is a block diagram for illustrating a state of connection of the JTAG circuits on a printed circuit board and a state in storing load data into the JTAG circuit in an SCI.

FIG. 2 is a block diagram showing a structure of a processing system having a testing mechanism (a JTAG circuit) according to an embodiment of this invention. As shown in FIG. 2, a processing system 10 according to this embodiment has an SVP 11, an SCI 12 and a main apparatus 13 similarly to that shown in FIGS. 20 and 21. Incidentally, like reference characters in FIG. 2 designate like or corresponding parts described hereinbefore, detailed descriptions of which are thus omitted.

The SVP 11 is connected to the main apparatus 13 via the SCI 12 to maintain the entire system and controls operations of the entire system. The SVP 11 issues control commands to control registers in each printed circuit board 14 constituting the main apparatus 13, to write data in a storage, to read data from the storage and the like. Incidentally, FIG. 2 shows only one printed circuit board 14 constituting the main apparatus 13, but another printed circuit board 14 are configured similarly to that shown in FIG. 2, which are connected to the SCI 12.

Each LSI (a chip component) 15 mounted on the printed circuit board 14 has a JTAG circuit 16 as a testing mechanism. The SVP 11 also controls the JTAG circuit 16 via the SCI 12. For this, the SCI 12 and each of the printed circuit boards 14 in the main apparatus 13 are connected to each other over a signal line 17 used to transmit/receive various commands or data in order to control the JTAG circuit 16.

Figure 18:
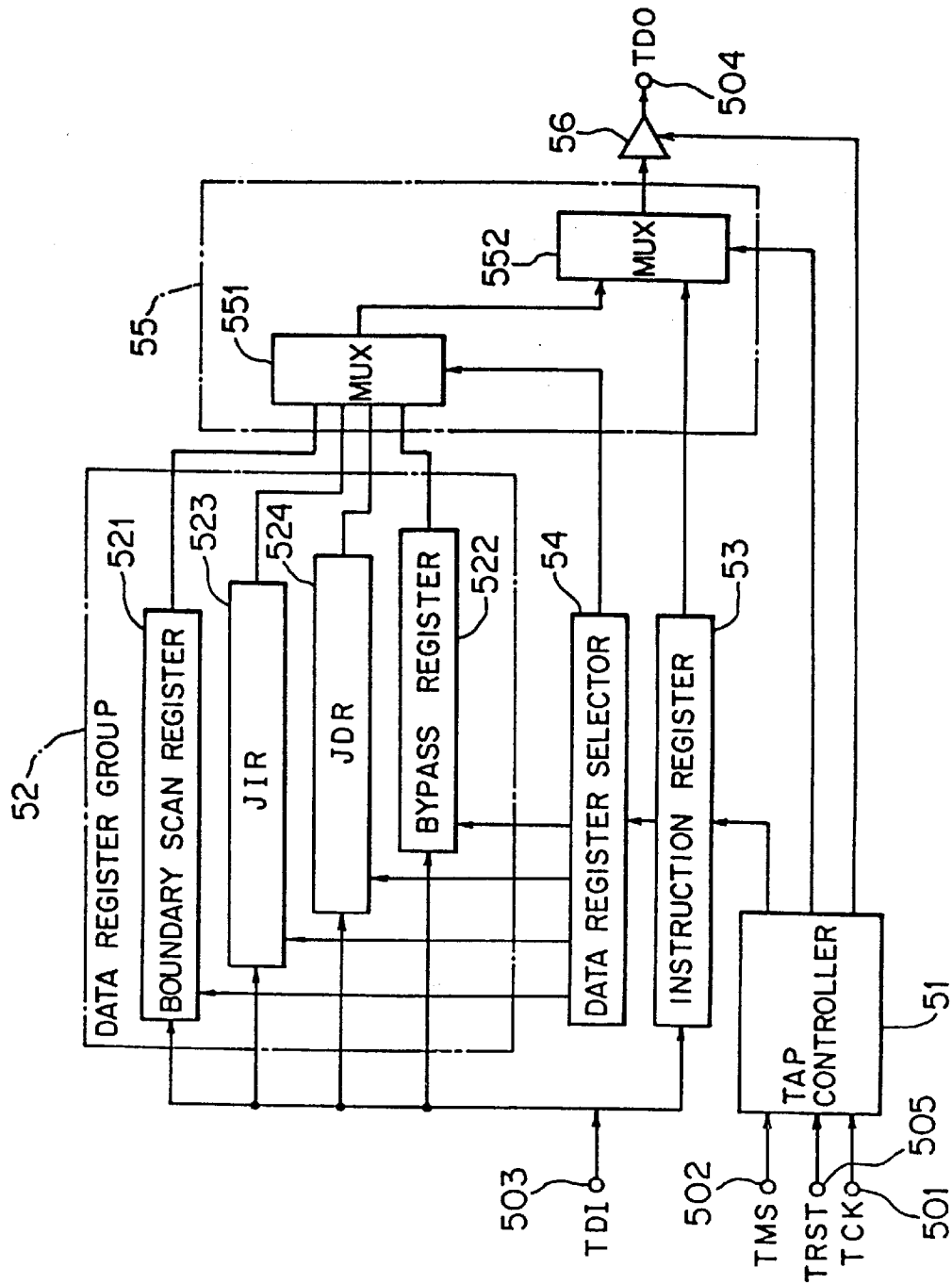
FIG. 18 is a block diagram showing an example of a structure of the JTAG circuit having the JIR and the JDR.

Incidentally, FIG. 2 shows in detail the JTAG circuit 16 in one LSI 15, although showing schematically only essential parts [an instruction register 53, a JIR 523, an JDR 524, a data register selector (a selecting circuit) 54 and an output side selecting circuit 55] of the JTAG circuits 16 in other LSIs 15. However, the JTAG circuit 16 in each LSI 15 has the same structure. The structure of each JTAG circuit 16 is quite similar to that described hereinbefore with reference to FIG. 18, a detailed description of which is thus omitted.

A test data output TDO of the JTAG circuit 16 of each LSI 15 is connected to a test data input TDI of the JTAG circuit 16 of another LSI 15 on the same printed circuit board 14, whereby a scan chain making a round of LSIs 15 is formed in each of the printed circuit boards 14.

The SCI 12 has a JTAG data storing unit 20 for storing beforehand therein data that should be written in each of the registers (the IR 53, the JIR 523, the JDR 524) connected like a chain in the shifting operation.

In the JTAG data storing unit 20 according to this embodiment, there are provided a data storing unit for the IR 21, a data storing unit for JIR 22 and a data storing unit for JDR 23 corresponding to respective types of the registers (three, here) along with a selecting circuit 24 and a TDR (a test data register) 25. Incidentally, FIG. 2 functionally shows a structure of the data storing unit 20. An actual structure of the data storing unit 20 will be described later with reference to FIG. 3.

In the data storing unit for IR 21, there are provided a data register for object (a data storage for a chip component that is an object) 21A and a data register for non-object (a data storage for chip components that are non-objects) 21B along with a switching circuit 21C for switching between the registers 21A and 21B and outputting data of either one of the registers 21A and 21B.

Likewise, in the data storing unit for JIR 22, there are provided a data register for object (a data storage for a chip component that is an object) 22A and a data register for non-object (a data storage for chip components that are non-objects) 22B, along with a switching circuit 22C for switching between the registers 22A and 22B and outputting data of either one of the registers 22A and 22B.

In the data storing unit for JDR 23, there is provided only a data register for object (a data storage for a chip component that is an object) 23A.

The data registers for object 21A, 22A and 23A hold data that should be written in the instruction register 53, the JIR 523 and the JDR 524, respectively, of an LSI 15 set in an object LSI number register (an object chip component setting unit) 26 which will be described later with reference to FIG. 3. The data register for non-object 21B holds instructions (an NOP, a bypass code, the same code as that written in the data register for object 21A, etc.) that should be written in the instruction registers 53 for non-object LSIs 15 excepting an object LSI. The data register for non-object 22B holds a no operation instruction [an NOP (NO OPERATION) command; hereinafter simply called an NOP occasionally] that should be written in the instruction registers 53 and the JIRs 523 of non-object LSIs 15 excepting an object LSI. Data setting to these registers 21A, 22A, 23A, 21B, 22B and 26 is implemented from the SVP 11.

The selecting circuit 24 selects data from the data storing unit for IR 21, the data storing unit for JIR 22 or the data storing unit for JDR 23 depending on which register among the instruction resistor 53, the JIR 523 and the JDR 524 the scan operation is currently performed on, and outputs the data to the TDR 25. Data stored in the TDR 25 is sent to each of the JTAG circuits 16 over the signal line 17 in the shifting operation.

Next, description will be made of a detailed structure of the JTAG storing unit 20 according to this embodiment with reference to FIG. 3. Incidentally, like reference characters in FIG. 3 designate like or corresponding parts described hereinbefore, detailed descriptions of which are thus omitted.

Figure 3:
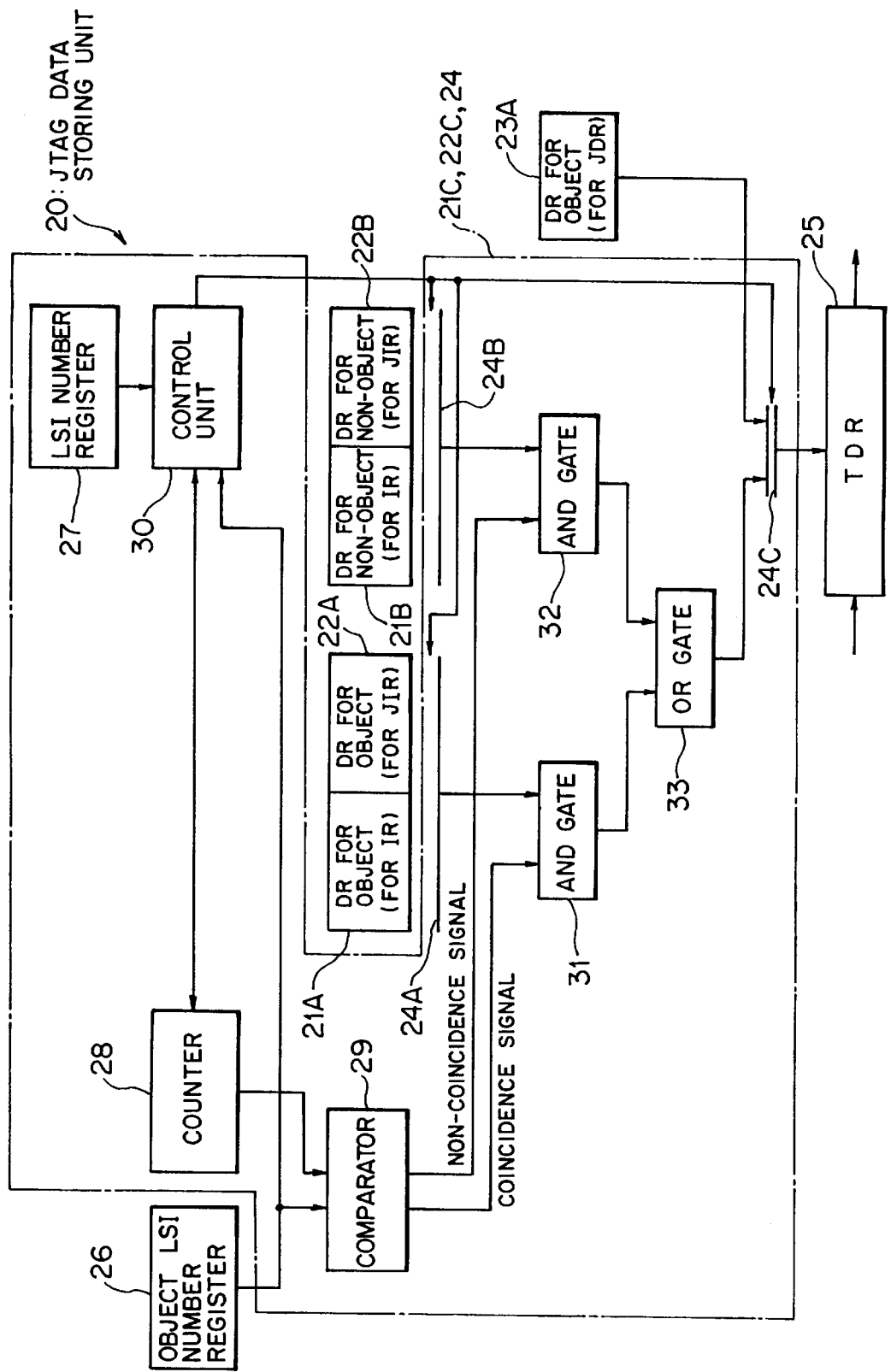
FIG. 3 is a block diagram showing a detailed structure of a JTAG data storing unit according to the embodiment.

As shown in FIG. 3, a part corresponding to the switching circuits 21C and 22C, and the selecting circuit 24 described above with reference to FIG. 2 is configured with selectors 24A through 24C, an object LSI number register 26, an LSI number register 27, a counter 28, a comparator 29, a control unit 30, AND gates 31 and 32, and an OR gate 33 according to this embodiment.

The selectors 24A through 24C practically correspond to the selecting circuit 24 described hereinbefore with reference to FIG. 2, which are controlled by the control unit 30 according to which register among the instruction register 53, the JIR 523 and the JDR 524 the scan operation is currently performed on.

The selector 24A selects either data from the register 21A or data from the register 22A and outputs selected data to the AND gate 31. During the scan operation on the instruction register 53, the selector 24A selects data from the register 21A and outputs it to the AND gate 31. During the scan operation on the JIR 523, the selector 24A selects data from the register 22A and outputs it to the AND gate 31.

The selector 24B selects either data from the register 21B or data (NOP) from the register 22B and outputs it to the AND gate 32. During the scan operation on the instruction register 53, the selector 24B selects the data from the register 21B and outputs it to the AND gate 32. During the scan operation on the JIR 523, the selector 24B selects NOP from the register 22B and outputs it to the AND gate 32.

Further, the selector 24C selects either an output from an OR gate 33, which will be described later or data from the register 23A and outputs the selected one to the TDR 25. During the scan operation on the instruction register 53 or the JIR 523, the selector 24C selects the output from the OR gate 33 and outputs it to the TDR 25. During the scan operation on the JDR 524, the selector 24C selects data from the register 23A and outputs it to the TDR 25.

The object LSI number register 26 is set therein information as to an object LSI 15 in order to designate the object LSI 15 having the instruction register 53, the JIR 523, the JDR 524 in which data should be written. According to this embodiment, serial numbers given to the LSIs 15 connected like a chain on each of the printed circuit boards 14 in the order connected are used as information for designating an object LSI 15.

According to this embodiment, the part corresponding to the switching circuits 21C and 22C and the selecting circuit 24, and the TDR 25 configure a data control unit for writing data held in the data registers for object 21A, 22A and 23A in the instruction register 53, the JIR 523, the JDR 524, respectively, on an LSI 15 set in the object LSI number register 26 in the shifting operation.

The LSI number register 27 is beforehand set therein a total number of the LSIs 15 each having the JTAG circuit 16 and connected to the scan chain on the same printed circuit board 14. The counter 28 counts up a count value by one each time data is sent to one LSI 15, which is served to grasp which LSI 15 a process is performed on. The LSI number register 27 is set therein "0" as an initial value.

Figure 5:
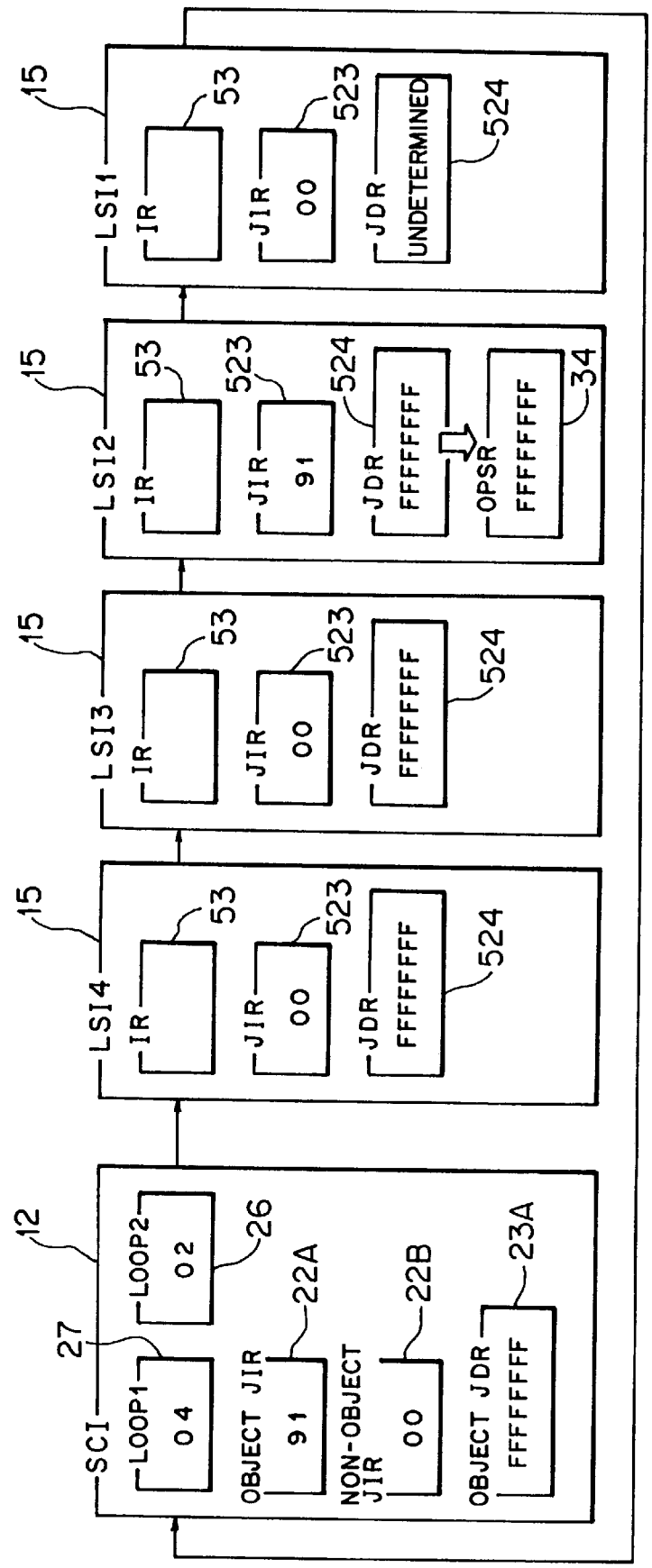
FIG. 5 is a block diagram showing a concrete example of data and a state in which the data is set when data loading is implemented on a predetermined JDR according to the embodiment.
Figure 8:
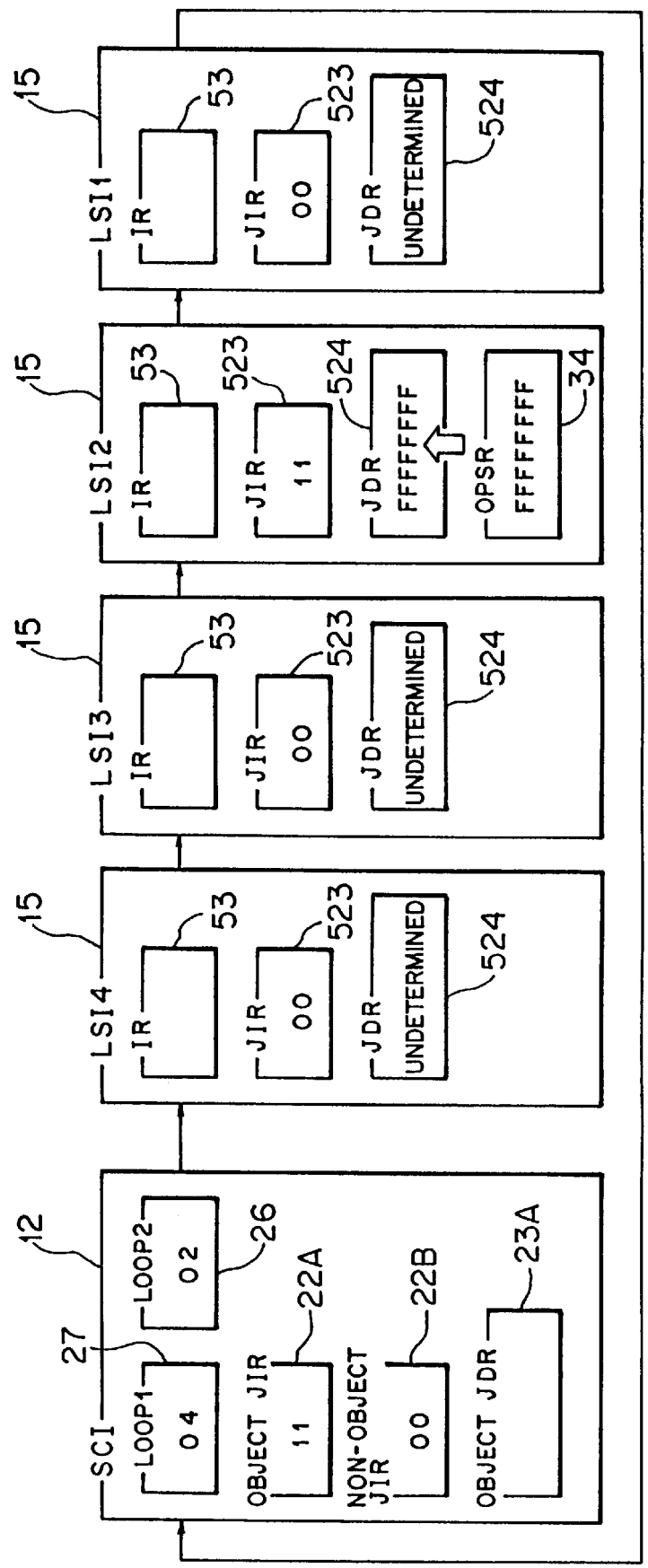
FIG. 8 is a block diagram showing a concrete example of data and a state in which the data is set when data sensing is implemented from a predetermined JDR according to the embodiment.

The comparator 29 compares a count value by the counter 28 with a serial number of an object LSI 15 set in the object LSI number register 26, and outputs a result of the comparison as a coincidence signal or a non-coincidence signal. If the result of the comparison does not coincide, the comparator 29 pulls down a coincidence signal and makes a non-coincidence signal be in a raised state. If the result of the comparison coincides, the comparator 29 raises a coincidence signal and makes a non-coincidence signal be in a pulled-down state. Note that serial numbers of the LSIs 15 are set as 1, 2, . . . from the down-stream side of the chain connection so as to identify an object LSI 15 as shown in FIGS. 5 and 8, for example.

The control unit 30 controls data sending according to set values of the object LSI number register 26 and the LSI number register 27, a count value of the counter 28 and the like. The control unit 30 also has a function to control a selecting/switching state of the selectors 24A through 24C as stated hereinbefore.

The AND gate 31 calculates a logical product of a coincidence signal from the comparator 29 and data inputted via the selector 24A from either the data registers for object 21A or 22A, and outputs it. The AND gate 31 can output data from either the data register for object 21A or 22A if a coincidence signal rises.

The AND gate 32 calculates a logical product of a non-coincidence signal from the comparator 29 and data from either the data register for non-object 21B or 22B via the selector 24B. If a non-coincidence signal rises, the AND gate 32 can output data for non-object such as NOP or the like.

The OR gate 33 calculates a logical sum of an output of the AND gate 31 and an output of the AND gate 32, and outputs it to the above-mentioned selector 24C.

Next, an operation of the JTAG data storing unit 20 with the above structure will be schematically described with reference to a flowchart (Steps S1 through S6) shown in FIG. 4.

First, predetermined data is set to each of the registers 21A, 22A, 23A, 21B, 22B, 26 and 27 from the SVP 11. After that, the counter 28 is initialized by the control unit 30 when the scanning operation is initiated (Step S1). Then, 1 is added to a count value by the counter 28 (Step S2).

The comparator 29 compares the count value with a serial number of an object LSI 15 set in the object LSI number register 26 (Step S3). If a result of the comparison does not coincide (if a judgement at Step S3 is NO) and a register which is an object of the scanning operation is the instruction register 53 or the JIR 523, a non-coincidence signal from the comparator 29 rises, data for non-object such as NOP or the like of the data register for non-object 21B or 22B is sent out to the TDR 25 via the selector 24B, the AND gate 32, the OR gate 33 and the selector 24C, the data is then written in the instruction registers 53 or the JIRs 523 of the non-object LSIs 15 in the shifting operation (Step S4).

On the other hand, if a result of the comparison by the comparator 29 coincides (if a judgement at Step S3 is YES), a coincidence signal from the comparator 29 rises, data that should be written in a register that is an object of the process is sent out from the data register for object 21A or 22A to the TDR 25 via the selector 24A, the AND gate 31, the OR gate 33 and the selector 24C, the data is then written in the instruction register 53, the JIR 523 or the JDR 524 of the object LSI 15 in the shift operation (Step S5).

If a count value by the counter 28 reaches the number set in the LSI number register 27 (if a judgement at Step S6 is YES), the procedure returns to Step S1. If the count value by the counter 28 does not reach the number set in the LSI number register 27 (if a judgement at Step S6 is NO), the procedure returns to Step S2.

As will be described later with reference to FIGS. 5 through 7, data of the data register for object 23A is sent out to the TDR 25 via the selector 24C irrespective of whether a result of the comparison by the comparator 29 coincides or not, and written in the JDR 524 in the shifting operation, according to this embodiment. When the data writing in the JDR 524 of an object LSI 15 is completed, the control unit 30 stops the shifting operation to terminate a data loading process.

As this, the general technique needs to set data in the JDRs 524 of all LSIs 15 since command codes are set in the JIRs 523 of all LSIs 15. According to this embodiment, if an object LSI 15 is determined, an NOP command is set in the JIRs 523 of another LSIs (non-object LSIs) 15, whereby any data written in the JDR 524 of a non-object LSI 15 is nullified. In consequence, only the data register for object 23A is provided to the data storing unit 23 for the JDR 524 according to this embodiment.

As will be described later with reference to FIGS. 5 through 10, it is possible to complete an operation until data is set in the JDR 524 of an object LSI 15 in the event of data loading, or until data stored in the JDR 524 of an object LSI 15 is stored in a register in the SCI 12 in the event of data sensing so that an execution time required for a data loading process or a data sensing process may be shortened.

Next, description will be made of a concrete example of data loading implemented on a predetermined JDR 524. Here, assuming that there are provided four LSIs 15 and serial numbers from 1 through 4 are given to the respective LSIs 15, as shown in FIG. 5, and data is loaded in an OPSR 34 included in an LSI 15 having a serial number 2 (LSI-2) via the JDR 524.

As shown in FIG. 5, "02" representing a serial number 2 is set in the object LSI number register (LOOP 2) 26 in the SCI 12. "04" representing a total number 4 of the LSIs 15 is set in the LSI number register (LOOP 1) 27. "91" (HEX) which is a load code of the OPSR 34 is set in the data register for an object JIR 22A. "00" which is an NOP code is set in the data register for non-object JIRs 22B. Data "FFFFFFFF" (HEX) that should be stored in the OPSR 34 is set in the data register for an object JDR 23A. These settings are all implemented from the SVP 11. FIG. 5 shows contents of data stored in the registers 523, 524 and 34 in each LSI 15 as a result of a data loading implemented in a procedure shown in FIGS. 6 and 7.

According to this embodiment, as not shown in FIG. 5, a code (50) corresponding to a "JIR SET" instruction is set at the time of the first SHIFT-IR, whereas a code (51) corresponding to a "JDR SET" instruction is set at the time of the second SHIFT-IR in the data register for an object IR 21A and a data register for non-object IRs, as will be described later.

FIGS. 6 and 7 show state transition in the case where a command is set in the JIR 523 according to the example of data setting as shown in FIG. 5, after that, data is set in the JDR 524. The state transition shown in FIGS. 6 and 7 is the diagram showing the state transition shown in FIG. 19 arranged in the order of actual transition.

States S04 through S20 shown in FIG. 6 show state transition in the case where the "JIR SET" instruction is set in the instruction register 53. The "JIR SET" instruction is to select the JIR 523 of the data register group 52 in each of the JTAG circuits 16 of the four LSIs 15 to connect the JIR 523 to the test data input TDI and the test data output TDO.

First, the test mode selecting signal TMS is made "0" and the test clock signal TCK is raised, whereby the state transits from a TEST-LOGIC-RESET state (S01) to a RUN-TEST/IDLE state (S02). After this, the state is assumed to transit under a state of the test mode selecting signal TMS at the time of a rise of the test clock signal TCK.

The state transits from the RUN-TEST/IDLE state (S02) to an SELECT-IR-SCAN state (S04) via a SELECT-DR-SCAN state (S03). At this time, a scan sequence of the instruction register 53 is initialized.

When the state transits to a CAPTURE-IR state (S05), a fixed pattern is captured in a shift register in the instruction register 53. However, the fixed pattern is not used here.

When the state transits to a SHIFT-IR state (S06), the shift register constituting the instruction register 53 is connected to the test data input TDI and the test data output TDO, whereby data is shifted toward the test data output TDO. Here, the instruction register 53 is configured as a shift register of 8 bits so that an instruction is set in the instruction register 53 of one LSI 15 by shifting the data eight times.

After that, the state transits to an EXIT1-IR state (S07), in which a count value of the counter 28 is incremented by one so that the count value becomes 1. After that, the states transits to the second SHIFT-IR state (S10) via a PAUSE-IR state (S08) and an EXIT2-IR state (S09). When the state transits to the PAUSE-IR state (S08), a process such as to load a new pattern in a storage of the testing mechanism or the like is implemented.

In order to set an instruction in the instruction register 53 of a LSI 15 in the next stage, the state transits again to the SHIFT-IR state (S10). According to this embodiment, there are provided four LSIs 15 so that transition similar to the states S06 through S09 described above is repeated four times. The second repetition is states S10 through S13. The third repetition is states S14 through S17. The fourth repetition is states S18 and S19.

At the time of the fourth repetition, that is, when a count value of the counter 28 becomes 4 that is a total number of the LSIs 15 via an EXIT1-IR state (S19), the state transits to an UPDATE-IR state (S20).

When the state transits to the UPDATE-IR state (S20), a new instruction obtained in the above shifting operation is loaded to and latched by the instruction register 53. The latched instruction is outputted in parallel and inputted to the data register selector 54.

Figure 4:
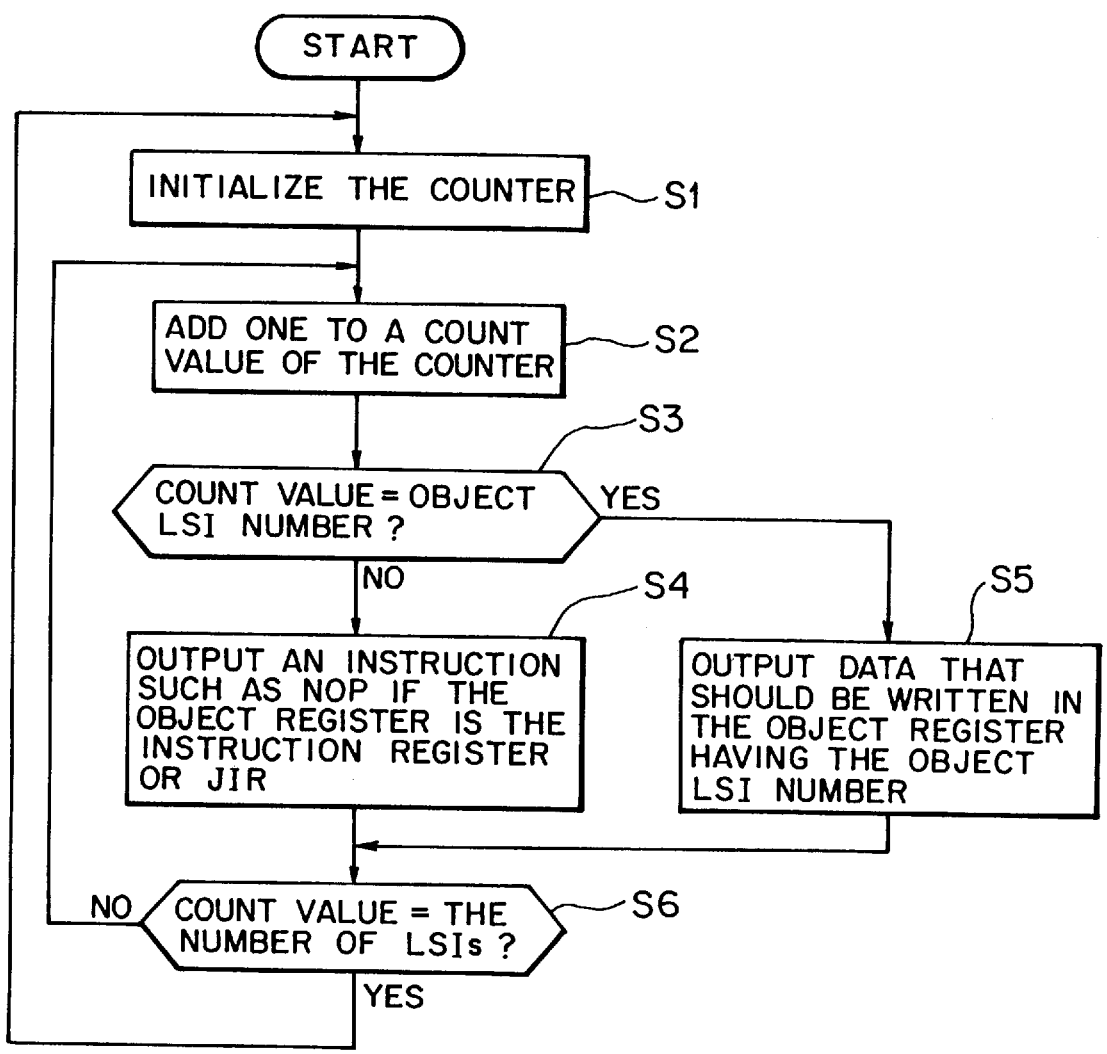
FIG. 4 is a flowchart for schematically illustrating an operation of the JTAG data storing unit according to the embodiment.

Here, a "JIR SET" instruction similar to that set in the data register for object for the IR 21A is set in the data register for non-object for the IR 21B, whereby the "JIR SET" instruction is set in all instruction registers 53 of four LSIs 15 according to the state transition described above and the procedure described hereinbefore with reference to FIGS. 3 and 4. In consequence, the JIR 523 is connected to the test data input TDI and the test data output TDO in the JTAG circuit 16 of each LSI 15.

States S21 through S37 shown in FIG. 6 show state transition when a JTAG command code ("91" here) is set in the JIR 523 of an LSI 15 having a serial number 2. The states S21 through S37 are almost the same as the states S04 through S20 described above.

A difference is that data from the test data input TDI is inputted to the JIR 523 and data shifted out from the JIR 523 is sent out to the test data output TDO in each JTAG circuit 16, detailed descriptions of which are thus omitted.

According to this embodiment, the JIR 523 is configured with an 8-bit (8-stage) shift register. Therefore, the shifting operation is repeated eight times in the SHIFT-DR state (S23, S27, S31 and S35).

According to the transition in the above states S21 through S37 and the procedure described hereinbefore with reference to FIGS. 3 and 4 (a function of the comparator 29 or a process at Step S3), "91" (HEX) that is a load code of the OPSR 34 is stored in only the JIR 523 of the LSI 15 having a serial number 2, whereas "00" that is the NOP code is stored in the JIRs 523 of another LSIs 15, as shown in FIG. 5.

When the state transits to an UPDATE-DR state (S37), the command set in the JIR 523 is transferred to a command analysing unit in a command control unit not shown, in which a command analysis is implemented. Here, the command is a command to load data in the OPSR 34 so that data that should be written in the OPSR 34 is set in the JDR 524 in the shifting operation which will be described below, after that, the command is executed.

States S39 through S55 shown in FIG. 7 show state transition in the case where the "JDR SET" instruction is set in the instruction register 53. The "JDR SET" instruction is to select the JDR 524 in the data register group 52 in the JTAG circuit 16 of each of the four LSIs 15 so as to connect the JDR 524 to the test data input TDI and the test data output TDO. The operation is quite similar to the operation described above excepting that "JIR SET" is set in the instruction register 53 described hereinbefore in the states S04 through S20 and the instruction to be set is "JDR SET", a detailed description of which is thus omitted.

When the state transits to an UPDATE-IR state (S55), the "JDR SET" instruction is loaded in and latched by all instruction registers 53 of the four LSIs 15. The latched instruction is outputted in parallel and inputted to the data register selector 54. In the JTAG circuit 16 of each LSI 15, the JDR 524 is connected to the test data input TDI and the test data output TDO.

Next, states S56 through S67 shown in FIG. 7 show state transition in the case where load data ("FFFFFFFF" here) is set in the JDR 523 in the LSI 15 having a serial number 2.

When the state transits to a SHIFT-DR state (S58), the JDR 524 is connected to the test data input TDI and the test data output TDO so that data is shifted toward the test data output TDO one bit by one bit each time the test clock signal TCK is raised. Here, the JDR 524 is configured as a shift register of 32 bits and shifting is implemented 32 times, thereby setting the above-mentioned load data in the JDR 524 in one LSI 15.

After that, the state transits to an EXIT1-DR state (S59), in which a count value by the counter 28 is incremented by one so that the count value becomes 1. After that, the state transits to the second SHIFT-DR state (S62) via a PAUSE-DR state (S60) and an EXIT2-DR state (S61).

According to this embodiment, so long as the above-mentioned load data is stored in the JDR 524 of an object LSI 15 having a serial number set in the object LSI number register 26, it is possible to execute an aimed process. No matter what data is stored in the JDR 524 of non-object LSIs 15, no process is implemented owing to the NOP command in the JIR 523 in the non-object LSIs 15.

Therefore, when the data is shifted up to the JDR 524 of the object LSI 15 having a serial number 2, the shifting operation is terminated, whereby a process time may be shortened.

Namely, when the shift operation at a point of time when a count value of the counter 28 becomes [(total LSI number)–(a serial number of the object LSI 15)+1]=4−2+1=3 is completed, the shift operation is terminated. This terminating control is implemented by the control unit 30 shown in FIG. 3.

In the example shown in FIG. 7, when the state transits to the second SHIFT-DR state (S62), transition of states S62 through S65 quite similar to the states S58 through S61 described hereinbefore is done, after that, the state finishes the third SHIFT-DR state then transits to an EXIT1-DR state (S67), a count value by the counter 28 becomes 3, which means that the state transits to an UPDATE-DR state (S68).

When the state transits to the UPDATE-DR state (S68), the above-mentioned load data "FFFFFFFF" stored in the JDR 524 of the LSI 15 having a serial number 2 in the above-mentioned shifting operation is loaded in the OPSR 34 which is an object register within the object LSI 15 on the basis of a result of the above-mentioned command analysis as shown in FIG. 5. After that, the state transits to a RUN-TEST/IDLE state (S69).

Next, a concrete example in which data reading (data sensing) is implemented from a predetermined JDR 524 will be described with reference to FIGS. 8 through 10. As shown in FIG. 8, there are provided four LSIs 15 and serial numbers from 1 to 4 are given to the respective LSIs 15 similarly to the example shown in FIG. 5. Description will be made on an example in which data in the OPSR 34 included in an LSI 15 having a serial number 2 (LSI-2) is sensed via the JDR 524.

As shown in FIG. 8, in the SCI 12, "02" representing a serial number 2 is set in the object LSI number register (LOOP 2) 26, "04" representing a total number 4 of the LSIs 15 is set in the LSI number register (LOOP 1) 27, "11" (HEX) which is a sense code of the OPSR 34 is set in the data register for an object JIR 22A, "00" which is the NOP code is set in the data register for non-object JIRs 22B, and no data is set in the data register for an object JDR 23A. These settings are all implemented from the SVP 11.

A code (50) corresponding to the "JIR SET" instruction is set in the data register for an object IR 21A and the data register for non-object IRs 21B in the first SHIFT-IR, and a code (51) corresponding to the "JDR SET" instruction is set in the second SHIFT-IR according to this embodiment similarly to the case of the data writing described hereinbefore with reference to FIGS. 5 through 7, although that is not shown in FIG. 8.

FIGS. 9 and 10 show state transition in the case where a command is set in the JIR 523 according to the example of data setting as shown in FIG. 8, after that, data is read out from the JDR 524. The state transition shown in FIGS. 9 and 10 is the state transition diagram shown in FIG. 19 arranged in the order actually transiting.

States S101 through S120 shown in FIG. 9 are quite similar to the states S01 through S20 shown in FIG. 6, detailed descriptions of which are thus omitted. Through transition of these states S101 through S120, the "JIR SET" instruction is set in all instruction registers 53 of the four LSIs 15. Whereby, the JIR 523 is connected to the test data input TDI and the test data output TDO in the JTAG circuit 16 in each of the LSIs 15.

States S121 through S137 shown in FIG. 9 show state transition in the case where a JTAG command code ("11" here) is set in the JIR 523 of an LSI 15 having a serial number 2. The states S121 through S137 are quite similar to the states S21 through S37 described hereinbefore with reference to FIG. 6 excepting that the JTAG command code that should be set is different, detailed descriptions of which are thus omitted.

According to the transition in the states S121 through S137 and the procedure (a function of the comparator 29 and a process at Step S3) described hereinbefore with reference to FIGS. 3 and 4, "11" (HEX) which is a sense code of the OPSR 34 is stored in only the JIR 523 of the LSI 15 having a serial number 2, besides "00" which is an NOP code is stored in the JIRs 523 of another LSIs 15.

When the state transits to an UPDATE-DR state (S137), the command set in the JIR 523 is transferred to the command analyzing unit in the command control unit not shown, in which the command is analyzed.

States S139 through S155 shown in FIG. 10 show state transition in the case where a "JDR SET" instruction is set in the instruction register 53, which is quite similar to the states S39 through S55 shown in FIG. 7, detailed descriptions of which are thus omitted. Through the transition of the states S139 through S155, the "JDR SET" instruction is set in all instruction registers 53 of the four LSIs 15. Whereby, the JDR 524 is connected to the test data input TDI and the test data output TDO in the JTAG circuit 16 in each of the LSIs 15.

States S156 through S165 shown in FIG. 10 show state transition in the case where sense data ("FFFFFFFF", here) is read out from the JDR 523 of an LSI 15 having a serial number 2.

When the state transits to a CAPTURE-DR state (S157) via a SELECT-DR-SCAN state (S156), data of the OPSR 34 ("FFFFFFFF", here) is loaded in parallel as the sense data in the JDR 524 as shown in FIG. 8 since it is known here that the command to sense the data of the OPSR 34 is set in the JIR 523 as a result of the above-mentioned command analysis.

When the state transits to a SHIFT-DR state (S158), the JDR 524 is connected to the test data input TDI and the test data output TDO so that data is shifted one bit by one bit toward the test data output TDO each time the test clock signal TCK is raised. Here, the JDR 524 is configured as a shift register of 32 bits and shifting is implemented 32 times, whereby the data in the DR 524 of the LSI 15 having a serial number 2 is transferred to the JDR 524 of the LSI 15 having a serial number 1 in the next stage.

After that, the state transits to an EXIT1-DR state (S159), in which a count value by the counter 28 is counted up by one so that the count value becomes 1, the state then transits to the second SHIFT-DR state (S162).

According to this embodiment, if the above-mentioned sense data held in the LSI 15 having a serial number 2 is read out up to the SCI 12, it means that an aimed process is completed. No matter what data is stored in the JDRs 524 of non-object LSIs 15, no process is implemented owing to the NOP command in the JIRs 523 in the non-object LSIs 15 similarly to the example shown in FIG. 5.

In consequence, when the data is shifted up to the JDR 524 of the object LSI 15 having a serial number 2, the shifting operation is terminated, whereby a process time may be shortened.

Namely, the shifting operation at the time when a count value by the counter 28 becomes (a serial number of an object LSI 15)=2 is completed, the shifting operation is terminated. This terminating control is implemented by the control unit 30 shown in FIG. 3.

In the example shown in FIG. 10, when the state finishes the second SHIFT-DR state (S162), then transits to an EXIT1-DR state (S163), a count value of the counter 28 becomes 2 so that the state transits to an UPDATE-DR state (S164).

The above-mentioned sense data "FFFFFFFF" stored in the JDR 524 of the LSI 15 having a serial number 2 is thereby read out to the SCI 12 in the above shifting operation, and written in the data register for an object JDR 23A as shown in, for example, FIG. 8. After that, the state transits to a RUN-TEST/IDLE state (S165).

As above, it is possible to implement data loading or data sensing on various registers within each of the LSIs 15 utilizing the JTAG circuit 16 while the processing system normally operates according to this embodiment of this invention. Specifically, even if the number of LSIs 15 increases, it is possible to write predetermined data in the instruction register 53, the JIR 523 and the JDR 524 which are JTAG-related registers or read out data from these registers 53, 523 and 524 without causing an increase of the number of registers for setting data or a storage region for setting data. This feature can largely simplify a system structure, besides noticeably increasing an efficiency of a data setting process or data reading process.

(C) Description of Modifications of the Embodiment (C-1) In the case where plural object LSIs are set In the embodiment described above, a serial number is set in the object LSI number register 26 shown in FIG. 3 so as to designate one object LSI 15. However, it is possible to provide a register for setting an object LSI having bits equal to the number of LSIs 15 connected in a scan chain in the SCI 12 instead of the object LSI number register 26, in which each bit is corresponded to each of the LSIs and "1" is set to a bit of an object LSI 15, thereby designating plural object LSIs 15 simultaneously.

In such case, there is provided a judging circuit for judging which value "1" or "0" is set to a bit corresponding to a count value of the counter 28 in the register for setting an object LSI instead of the comparator shown in FIG. 3. The judging circuit outputs a signal (a coincidence signal) raised when judging that "1" is set to the AND gate 31, or outputs a signal (a non-coincidence signal) raised when judging that "0" is set to the AND gate 32.

Whereby, it becomes unnecessary to designate plural object LSIs 15 one by one when data loading or data sensing is implemented on the plural object LSIs 15. It is thereby possible to simultaneously set a command in plural object LSIs 15 in one JTAG scanning operation so that efficient data setting process or data reading process becomes feasible.

(C-2) In the case where a bypassing mechanism is used in a non-object LSI

The above embodiment has been described by way of an example where the same instructions are set in the instruction registers 53 of four LSIs 15. Alternatively, a bypass command may be set in the data register for non-object 21B for the instruction register 53, and set data or read data may be shifted from a bypass register (a shift register of one bit; a bypassing mechanism) 522 to an LSI 15 in the next stage by only shifting one bit when the data is set in the JIR 523 or the JDR 524, or the data is read out from the JDR 524.

Next, description will be made of a concrete example in which data from the preceding stage is sent out to the following stage via the bypass register 522 without passing through the registers 521, 523 and 524 in an non-object LSI 15 with reference to FIGS. 11 through 13 and Table 1.

Figure 11:
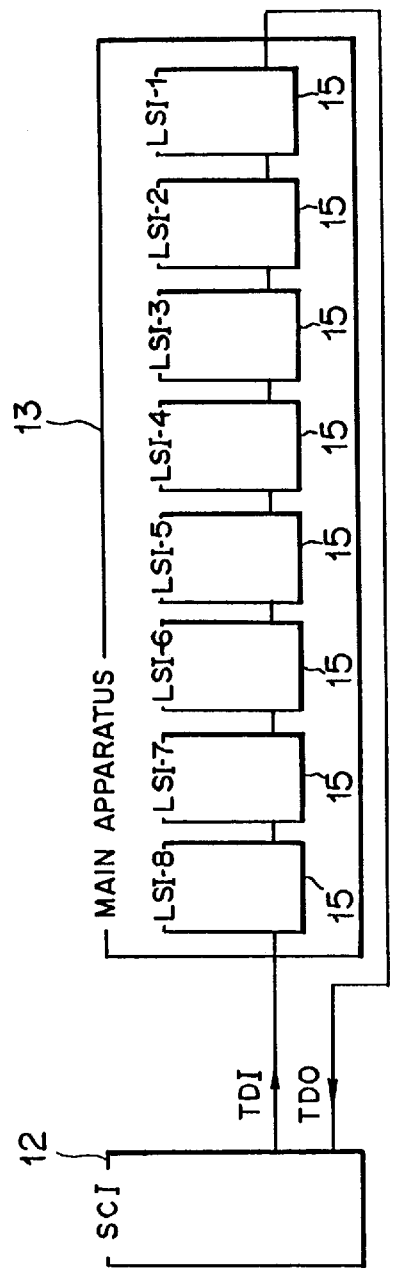
FIG. 11 is a block diagram schematically showing an example of a structure of a scan chain in order to illustrate an operation when bypassing mechanisms are used in non-object LSIs.

Assuming here that a scan chain making a round in eight LSIs 15 is formed on the printed circuit board 14 within the main apparatus 13, and serial numbers from 1 to 8 are given to the respective LSIs 15 as shown in FIG. 11. The description will be now made of an example in which data loading or data sensing is implemented on an LSI 15 having a serial number 3 (LSI-3). Incidentally, like reference characters in FIG. 11 designate like or corresponding parts described hereinbefore, detailed descriptions of which are thus omitted.

If a load command is executed using the technique described hereinbefore with reference to FIGS. 5 through 10 (namely, if the bypass register 522 is not used), the number of pulses of the test clock signal TCK for data shifting required to load data from the SCI 12 in an object LSI 15 (LSI-3) is as follows:

| | |
|---|---|
| (1) SHIFT-IR (50) | 8 bits × 8 LSIs = 64 |
| (2) SHIFT-DR (JIR) | 8 bits × 8 LSIs = 64 |
| (3) SHIFT-IR (51) | 8 bits × 8 LSIs = 64 |
| (4) SHIFT-DR (JDR) | 32 bits × 6 LSIs = 192 |

The number of pulses of the test clock signal TCK is 384 in total. If the number of LSIs is n and a serial number of an object LSI is m, the number of pulses is given by a general equation:

$$8n+8n+8n+32(n-m+1)=56n-32m+32 \qquad (1)$$

If a sense command is executed using the technique described hereinbefore with reference to FIGS. 5 through 10, the number of pulses of the test clock signal TCK for data shifting required to read data from an object LSI 15 (LSI-3) to the SCI 12 is as follows:

| | |
|---|---|
| (1) SHIFT-IR (50) | 8 bits × 8 LSIs = 64 |
| (2) SHIFT-DR (JIR) | 8 bits × 8 LSIs = 64 |
| (3) SHIFT-IR (51) | 8 bits × 8 LSIs = 64 |
| (4) SHIFT-DR (JDR) | 32 bits × 3 LSIs = 96 |

The number of pulses of the test clock signal TCK is 288 in total. If the number of LSIs is n and a serial number of an object LSI is m, the number of pulses is given by a general equation:

$$8n+8n+8n+32m=24n+32m \qquad (2)$$

In the above description, "50" is a numerical value (IR code) corresponding to the "JIR SET" instruction set in the instruction register 53, and "51" is a numerical value (IR code) corresponding to the "JDR SET" instruction set in the instruction register 53. These numerical values are set in the instruction registers 53 in all LSIs 15 irrespective of object/non-object.

If the bypass register 522 is used, a command (FF) to select the bypass register 522 is set in the instruction registers 53 in non-object LSIs 15 (LSI-1, 2 and 4 through 8), the bypass register 522 is selected by the data register 54, then data from the preceding stage is sent out to the following stage from the bypass register 522 without passing through the registers 521, 523 and 524.

In such case, user registers (the JIR 523 and the JDR 524) on the main apparatus 13 side are reset by the test reset signal TRST when the JTAG circuit 16 is activated (initialized), and NOP "00" is set in the JIR 523, whereas "00000000" is set in the JDR 524 in this resetting process as will be described later with reference to Table 1.

According to the technique described hereinbefore with reference to FIGS. 5 through 10, a numeral value used to designate a command is already set in the JIR 523. For this, if bypassing is implemented by means of the bypass register 522 in such state, a command corresponding to the numerical value in the JIR 523 will be activated. Accordingly, if the bypass register 522 is used, NOP "00" is set in the JIR 523, thereby preventing an unconcerned command from being accidentally activated as described above.

In order to reset the JIR 523 and the JDR 524 as above, a result of a logical sum of a reset signal at the time of throw-in of a power source and a test reset signal TRST is inputted to a reset terminal of each of the shift registers constituting the JIR 523 and the JDR 524 according to this embodiment.

Normally, only a reset signal at the time of throw-in of the power source is inputted to the reset terminal of the JIR 523, whereas the test reset signal TRST is used only to reset the TAP controller 51 and the instruction register 53 when a JTAG command is activated.

As above, the JIR 523 and the JDR 524 are reset by a result of a logical sum of a reset signal at the time of throw-in of the power source and the test reset signal TRST, whereby the JIR 523 and the JDR 524 are always reset when the JTAG command is activated so that the NOP and the zero data described above are set in the JIR 523 and the JDR 524, respectively.

Next, description will be made of a difference in processing rate between a case where the bypass register 522 is used as above and the case where the technique described hereinbefore with reference to FIGS. 5 through 10 is used (the case where the bypass register 522 is not used). The description will be made by way of an example in which data loading or data sensing is implemented on an LSI 15 having a serial number 3 (LSI-3) among the eight LSIs 15 as shown in FIG. 11.

If a load command is executed using the bypass registers 522 in non-object LSIs 15 (LSI-1, 2 and 4 through 8), the number of pulses of the test clock signal TCK for data shifting required to load data from the SCI 12 in the object LSI 15 (LSI-3) is as follows:

(1) SHIFT-IR (50)      8 bits × 8 LSIs = 64
(2) SHIFT-DR (JIR)     8 bits × 1 LSI + 5 = 13
(3) SHIFT-IR (51)      8 bits × 8 LSIs = 64
(4) SHIFT-DR (JDR)     32 bits × 1 LSI + 5 = 37

The number of pulses of the test clock signal TCK is 178 in total. If the number of LSIs is n and a serial number of an object LSI is m, the number of pulses is given by a general equation:

$$8n+8+(n-m)+8n+32+(n-m)=18n-2m+40 \qquad (3)$$

If a sense command is executed using the bypass register 522 in non-object LSIs 15 (LSI-1, 2 and 4 through 8), the number of pulses of the test clock signal TCK for data shifting required to read out data from the object LSI 15 (LSI-3) to the SCI 12 is as follows:

(1) SHIFT-IR (50)      8 bits × 8 LSIs = 64
(2) SHIFT-DR (JIR)     8 bits × 1 LSI + 5 = 13
(3) SHIFT-IR (51)      8 bits × 8 LSIs = 64
(4) SHIFT-DR (JDR)     32 bits × 1 LSI + 2 = 34

The number of pulses of the test clock signal TCK is 175 in total. If the number of LSIs is n and a serial number of an object LSI is m, the number of pulses is given by a general equation:

$$8n+8+(n-m)+8n+32+(m-1)=17n+39 \qquad (4)$$

A difference between the above equations (1) and (3) is 38n−30m−8, and a difference between the above equations (2) and (4) is 7n+32m−39, where n is a natural number, m is a natural number equal to n or less. If n is equal to 2 or more, these differences become larger than 0.

Namely, use of the bypass register 522 in a non-object LSI 15 makes data shifting on the JIR 523 or the JDR 524 unnecessary so that data loading or data sensing may be implemented with a less number of pulses of the test clock signal TCK than the case where the bypass register 522 is not used.

It is therefore possible to shorten a time required to write data (data loading) in the JDR 524 on an object LSI 15 or read data (data sensing) from the JDR 524 on an object LSI 15. This may further improve an efficiency of a data writing process or data reading process.

Next, description will be made of an example of actual values set in the IR 53, the JIR 523 and the JDR 524 when the JTAG command is issued with use of the bypass registers 522 in non-object LSIs 15, and a flow of an operation to set the values with reference to Table 1 and FIGS. 12 and 13.

| transition state | object IR | non-object IR | object JIR | non-object JIR | object JDR | non-object JDR |
|---|---|---|---|---|---|---|
| TEST-LOGIC-RESET | 80 | 80 | 00 | 00 | 00000000 | 00000000 |
| SHIFT-IR | 50 | FF | 00 | 00 | 00000000 | 00000000 |
| SHIFT-DR | 51 | FF | ** | 00 | 00000000 | 00000000 |
| SHIFT-IR | 50 | FF | ** | 00 | 00000000 | 00000000 |
| SHIFT-DR | 51 | FF | ** | 00 | YYYYYYYY | 00000000 |

In the above Table 1, "80" is a check code (actually 8-bit data in which 1 and 0 are placed in the higher two bits), "00" is a code used to designate NOP, "50" is an IR code used to designate the "JIR SET" instruction, "51" is an IR code used to designate the "JDR SET" instruction, "FF" is an IR code used to designate a select instruction (a bypass command) of the bypass register 522, "**" is an arbitrary command code, and "YYYYYYYY" is load data or sense data.

Here, description will be made of the case where data "YYYYYYYY" is written in an object JDR 524, or data "YYYYYYYY" held in the object JDR 524 is read out as shown in the lowest column of the above Table 1, for example, by executing the JTAG command.

In this case, data as below is beforehand set in each of the registers 21A, 21B and 22A described hereinbefore with reference to FIG. 2 or 3.

As the data register 21A for holding data that should be written in an object IR 53, there are actually provided one for the first time and another one for the second time as not shown in FIGS. 2 and 3. The data register 21A for the first time is set therein the IR code "50" designating the "JIR SET" instruction, whereas the data register 21A for the second time is set therein the IR code "50" designating the "JDR SET" instruction.

On the other hand, the data register 21B for non-object IRs 53 is set therein the IR code "FF" designating a select instruction (a bypass command) for the bypass register 522.

The data register 22A for an object JIR 523 is set therein an arbitrary command code (a load command, a sense command or the like) "**".

The non-object JIR 523 is bypassed by the bypass register 522 so that the SCI 12 outputs data for one bit ("0" or "1") for the bypass register 522 to the TDI. In consequence, there is no necessity to set a special value in the data register 22B for non-object JIRs 523.

If a load command is executed, data "YYYYYYYY" that should be written in the object JDR 524 is set in advance in the data register 23A for an object JDR 524.

Assuming here that the SCI 12 has a register for setting an object LSI having bits in number equal to the number of LSIs 15 connected in the scan chain as having been described in the item (C-1), and "1" is set in advance in a bit corresponding to the object LSI in the register for setting an object LSI (LOOP 1).

When the JTAG command is activated after various data as above have been set in the data registers, the test reset signal TRST causes the check code "80" to be set in the IRs 53 in a TEST-LOGIC-RESET state as shown in Table 1, whereas the NOP "00" is set in all the JIRs 523 and "00000000" is set in all the JDR 524.

It is then judged and confirmed in the first SHIFT-IR state whether an LSI having a count value by the counter 28 within the SCI 12 as a serial number is an object or a non-object depending on whether a corresponding bit of the above-mentioned register for setting an object LSI is "1" or "0".

If the corresponding bit is "1", a value "50" (8 bits) set in the data register 21A for the first time is outputted from the SCI 12 to the TDI. If the corresponding bit is "0", a value "FF" set in the data register 21B is outputted from the SCI 12 to the TDI. As a result, "50" is set in an object IR 53 and "FF" is set in non-object IRs 53 as shown in the second column in Table 1.

In the first SHIFT-DR state (at the time of setting of the JIR), data is set in the JIRs 523 according to "50" set in the object IR 53 in the object LSI, whereas the bypass register 522 is selected in each of the non-object LSIs.

Namely, whether an LSI having a count value by the counter 28 within the SCI 12 as a serial number is an object or a non-object is judged and confirmed depending on whether a corresponding bit of the register for setting an object LSI is "1" or "0", as well.

If the corresponding bit is "1", the value "" (8 bits) set in the data register 22A is outputted from the SCI 12 to the TDI. If the corresponding bit is "0", data for one bit for the bypass register 522 ("0" or "1") is outputted from the SCI 12 to the TDI. As shown in the third column of Table 1, "" is set in the object JIR 523, whereas NOP "00" remains set in the non-object JIRs 523.

In the second SHIFT-IR state, it is judged and confirmed, similarly to the above, whether an LSI having a count value by the counter 28 within the SCI 12 as a serial number is an object or a non-object depending on whether a corresponding bit to the register for setting an object LSI is "1" or "0".

If the corresponding bit is "1", a value "51" (8 bits) set in the data register 21A for the second time is outputted from the SCI 12 to the TDI. If the corresponding bit is "0", a value "FF" set in the data register 21B is outputted from the SCI 12 to the TDI. In consequence, "51" is set in the object IR 53, whereas "FF" is set in the non-object IRs 53, as shown in the fourth column of Table 1.

Finally, in the second SHIFT-DR state, data is set in the JDR 523 according to "51" set in the object IR 53 in an object LSI, whereas the bypass register 522 is selected in non-object LSIs.

Namely, whether an LSI having a count value by the counter 28 within the SCI 12 as a serial number is an object or a non-object is judged and confirmed depending on whether a corresponding bit of the register for setting an object LSI is "1" or "0".

If the corresponding bit is "1" when a load command is activated, data "YYYYYYYY" (32 bits) set in the data register 23A is outputted from the SCI 12 to the TDI. If the corresponding bit is "0", data for one bit ("0" or "1") for the bypass register 522 is outputted from the SCI 12 to the TDI. In consequence, "YYYYYYYY" is set in an object JDR 524, whereas zero data remains set in non-object JDRs 524 as shown in the lowest column of Table 1.

If the corresponding bit is "1" when a sense command is activated, the shifting operation for 32 bits is implemented in order to send out the sense data "YYYYYYYY" held in the object JDR 524. If the corresponding bit is "0", the shifting operation for one bit for the bypass register 522 is implemented.

Figure 12:
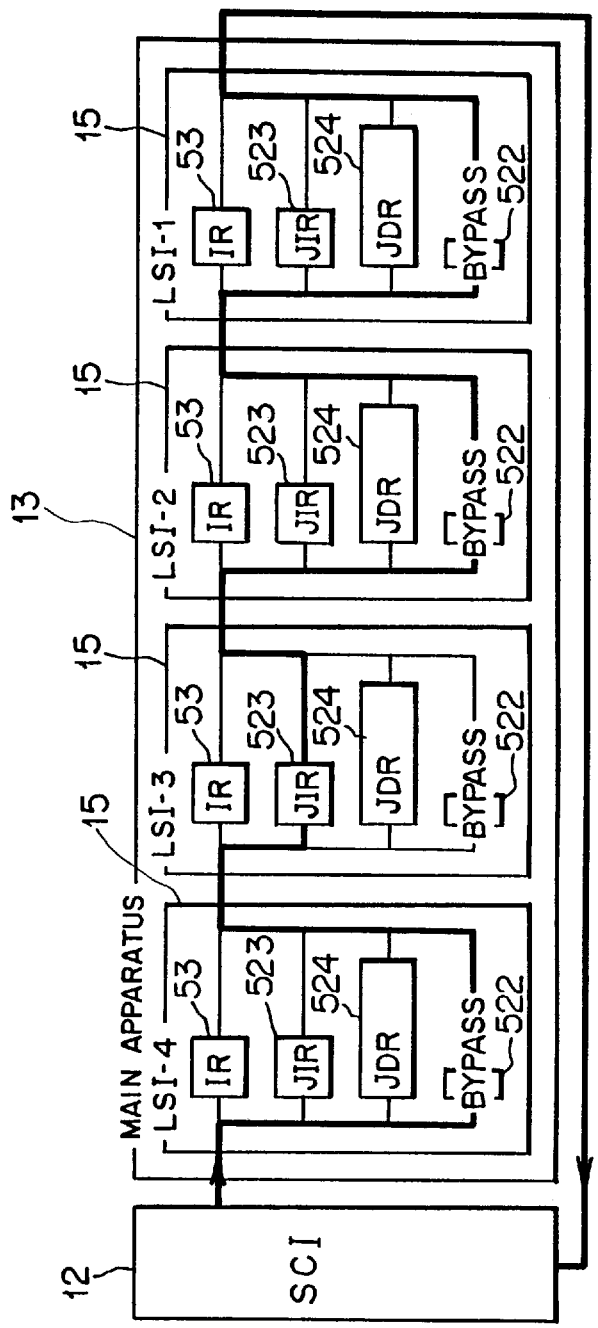
FIG. 12 is a block diagram showing a route of data flow when a JIR is set using the bypassing mechanisms in the non-object LSIs, in which a singular LSI is an object to be issued a command.
Figure 13:
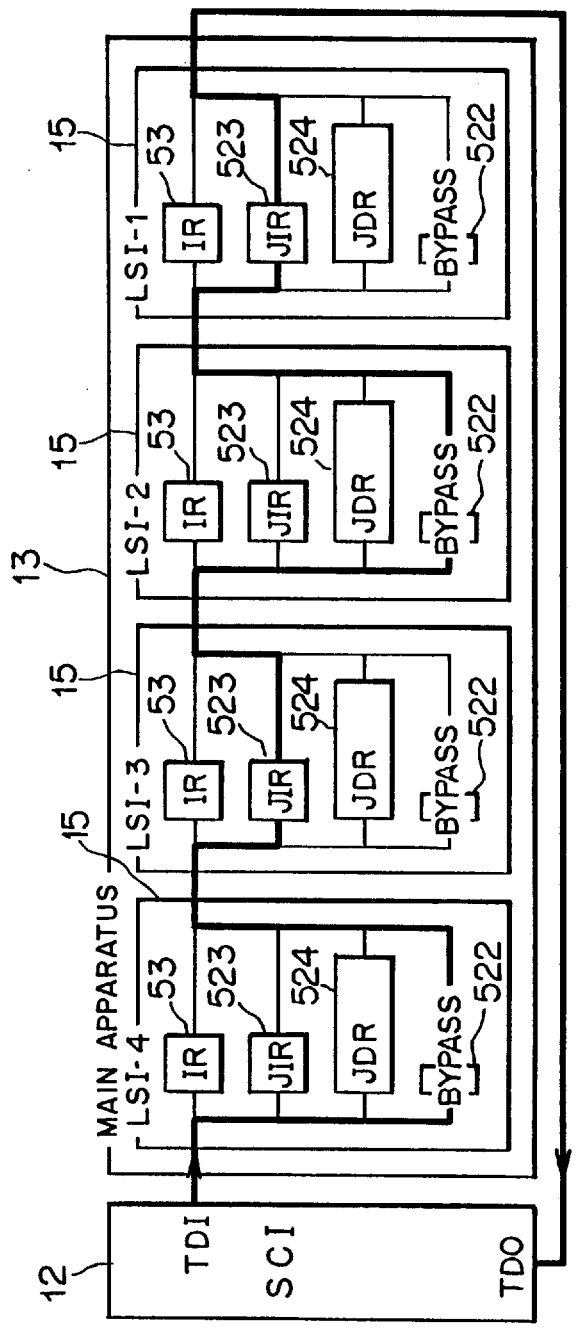
FIG. 13 is a block diagram showing a route of data flow when JIRs are set using the bypassing mechanisms in the non-object LSIs, in which plural LSIs are objects to be issued a command.

FIGS. 12 and 13 show more concrete routs of data flow in the case where there are provided four LSIs 15 and serial numbers from 1 to 4 are given to the respective LSIs 15 similarly to the examples shown in FIGS. 5 and 8. Incidentally, like reference characters in FIGS. 12 and 13 designate like or corresponding parts having been described hereinbefore, detailed descriptions of which are thus omitted.

FIG. 12 shows a route of data flow (thick solid line) in setting the JIR in the case where only an LSI 15 having a serial number 3 (LSI-3) is an object. In this case, the data passes through the bypass registers 522 in three non-object LSIs 15 (LSI-4, 2 and 1), but passes through the JIR 523 in only the object LSI 15 (LSI-3) as shown in FIG. 12.

FIG. 13 shows a route of data flow (thick solid line) in setting the JIR in the case where two LSIs (LSI-3 and 1) having serial numbers 3 and 1 are objects. In this case, the data passes through the bypass registers 522 in two non-object LSIs 15 (LSI-4 and 2), but passes through the JIRs 523 in only the two object LSIs 15 (LSI-3 and 1) as shown in FIG. 13.

(C-3) In the case where the JTAG command is activated by DMA

If the JTAG command mentioned above is activated by DMA, the JTAG command is normally issued the number of times designated beforehand. A general operation if the JTAG command is activated by DMA will be next described with reference to a flowchart (Steps A1 through A6) shown in FIG. 14.

Figure 14:
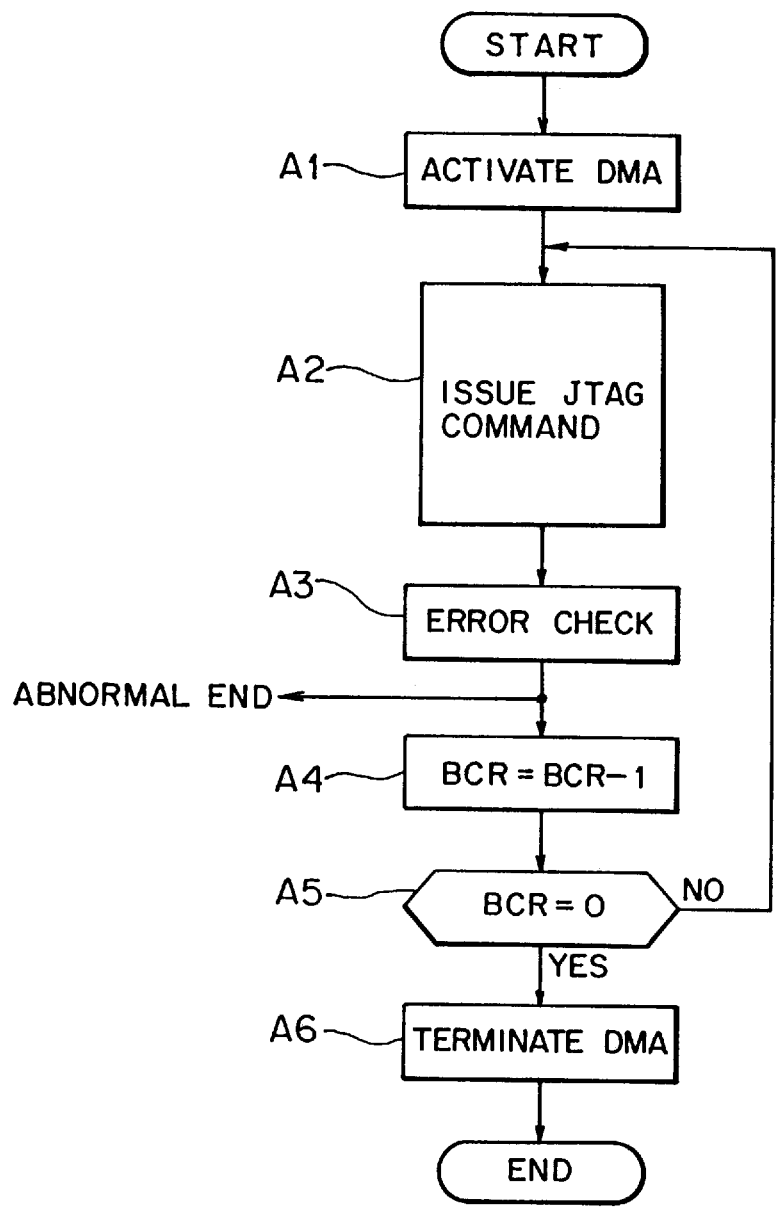
FIG. 14 is a flowchart for illustrating a normal operation if a JTAG command is activated by DMA.

The number of times the JTAG command is issued is first set in a number counter (BCR: Byte Count Register). As shown in FIG. 14, if the JTAG command is activated by DMA (Step A1), the JTAG command is issued as having been described with reference to FIGS. 5 through 10 or FIGS. 12 and 13 (Step A2), then error check is implemented (Step A3). If abnormality is detected in this error check, the process is abnormally ended. If the JTAG command is normally executed, the number counter value BCR is subtracted by one (Step S4).

Next, it is judged whether the number counter value BCR after the subtraction is 0 or not (Step A5). If the number counter value BCR is not 0, the procedure returns to Step A2, at which the JTAG command is repeatedly issued. If the number counter value BCR is 0, an activation by the DMA is terminated (Step A6).

Figure 16:
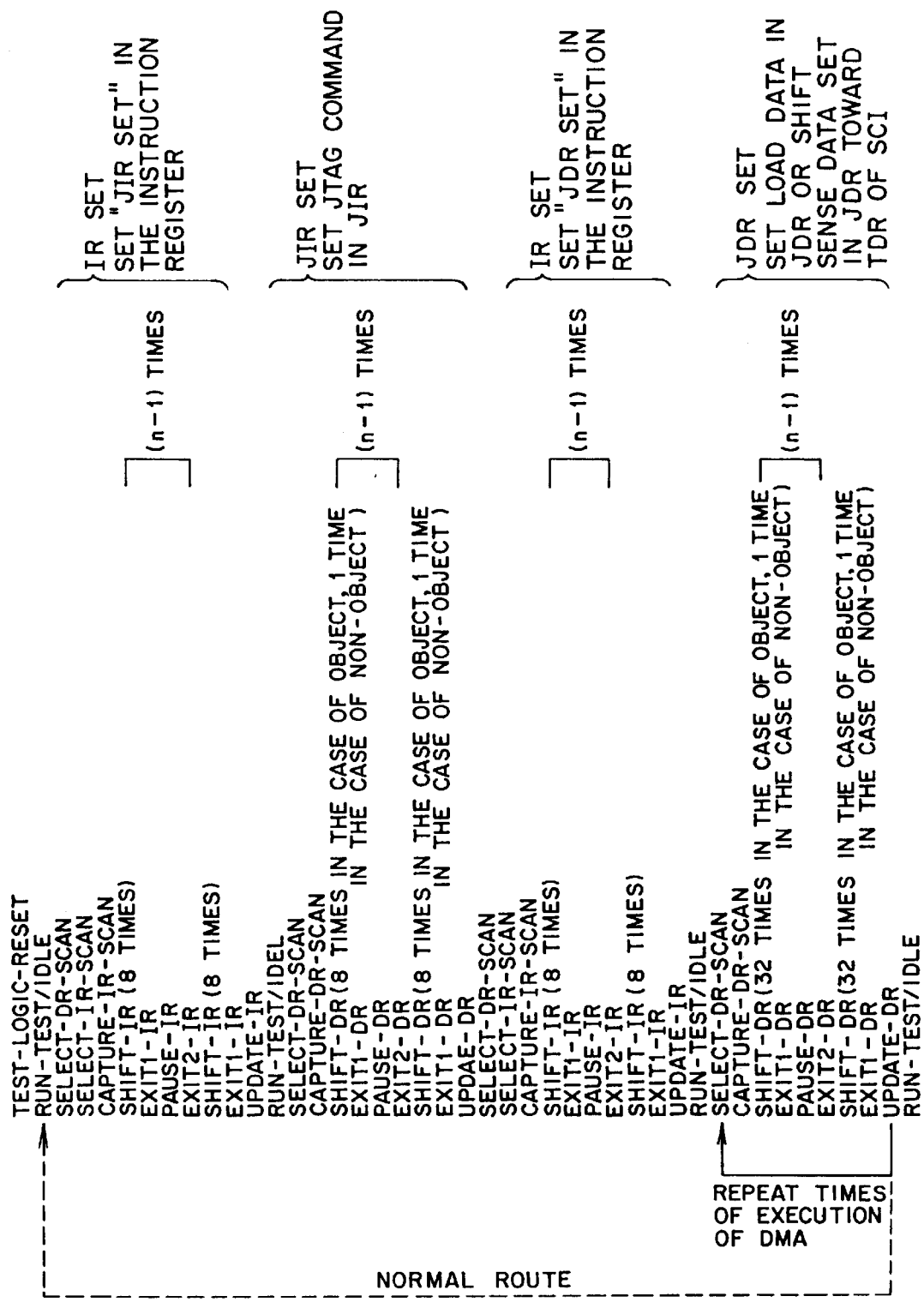
FIG. 16 is a diagram showing state transition in activating the JTAG command by DMA by comparing a normal case with a technique according to the embodiment.
Figure 17:
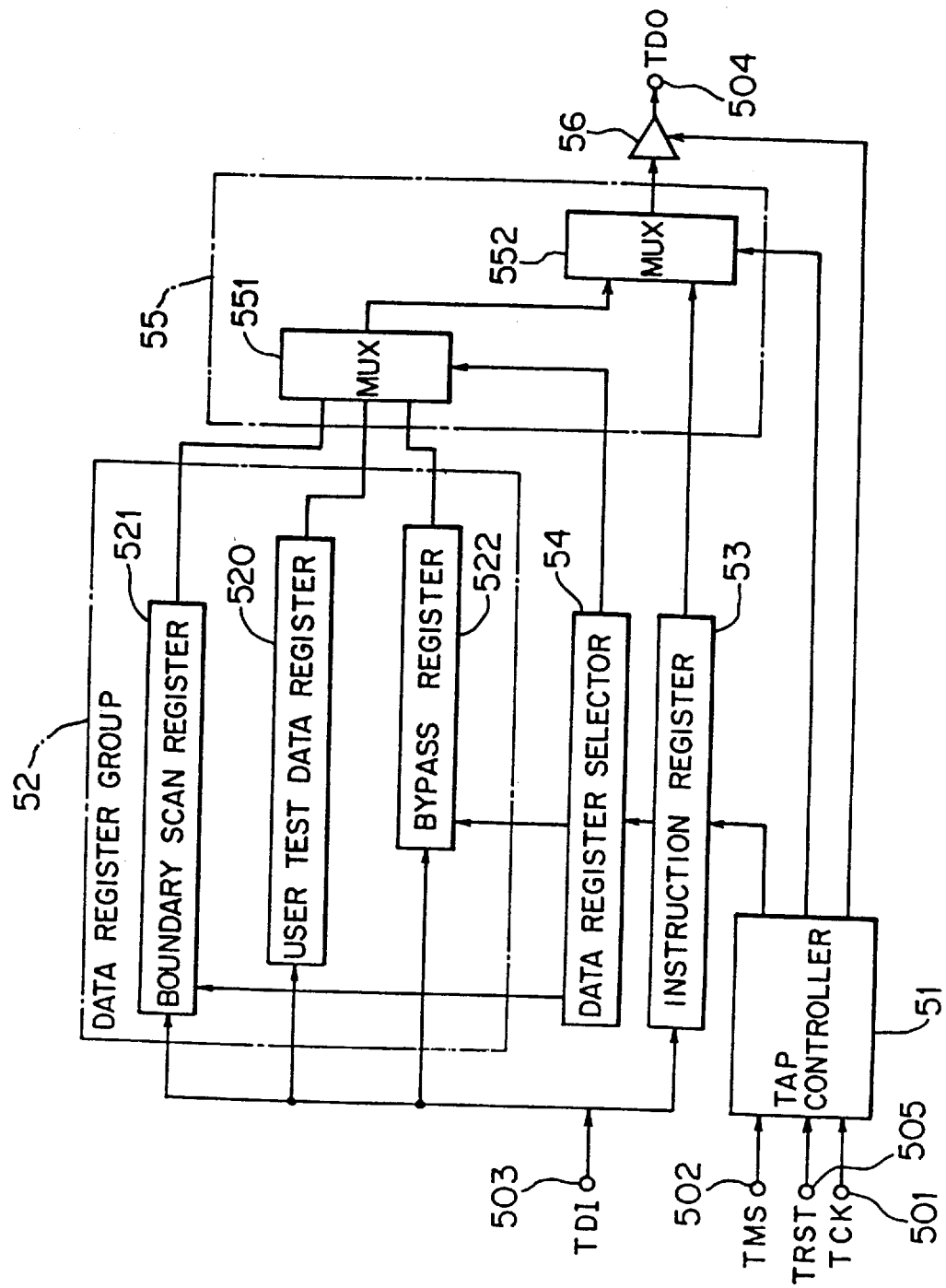
FIG. 17 is a block diagram showing an example of a structure of a general JTAG circuit.

FIG. 16 shows state transition in issuing the JTAG command at Step A2. In an example of state transition shown in FIG. 16, the technique using the bypassing mechanism in each of the non-object LSIs described in the item (C-2) is applied. Incidentally, each of the transition states is as having been described hereinbefore, a detailed descriptions of which is thus omitted.

After load data has been set in an object JDR 524 from the TDR 25 of the SCI 12, or after sense data set in an object JDR 524 has been shifted to the TDR 25 of the SCI 12, the state normally returns to a RUN-TEST/IDLE state as indicated by dotted line in FIG. 16, in which "IR SET", "JIR SET", "IR SET" and "JDR SET" are repeated the number of times designated.

Figure 19:
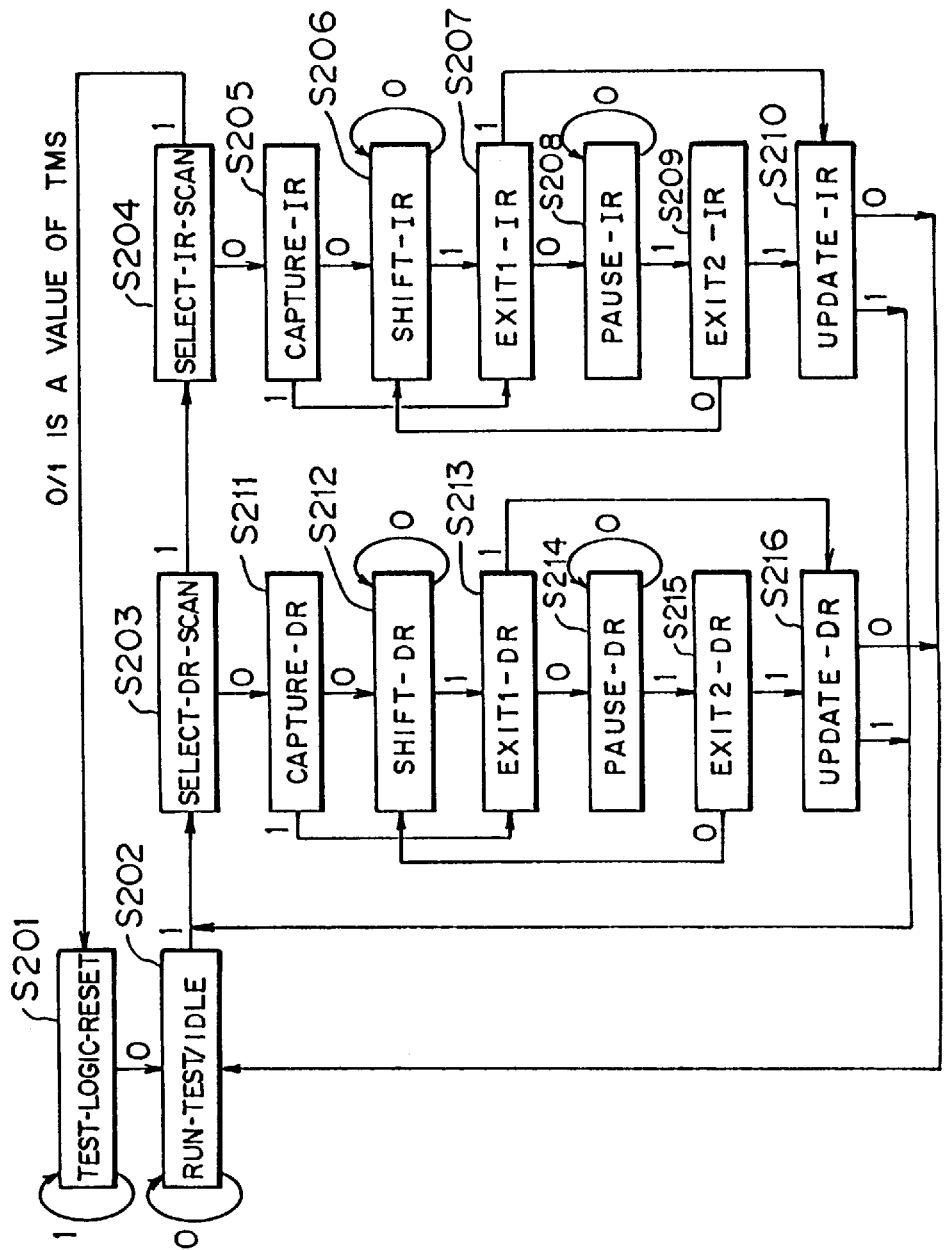
FIG. 19 is a flowchart showing state transition of a test logic in order to illustrate an operation of the JTAG circuit shown in FIG. 18.

Namely, if an instruction code set in the IR 53 is "50" (JIR SET) in the UPDATE-DR state (S216) shown in FIG. 19, a value of the test mode selecting signal TMS normally becomes 1 so that the procedure returns to the SELECT-DR-SCAN state (S203). However, if the instruction code set in the IR 53 is "51" (JDR SET), it is so set that a value of the test mode select signal TMS becomes "0" so that the procedure returns to the RUN-TEST/IDLE state (S202).

Figure 15:
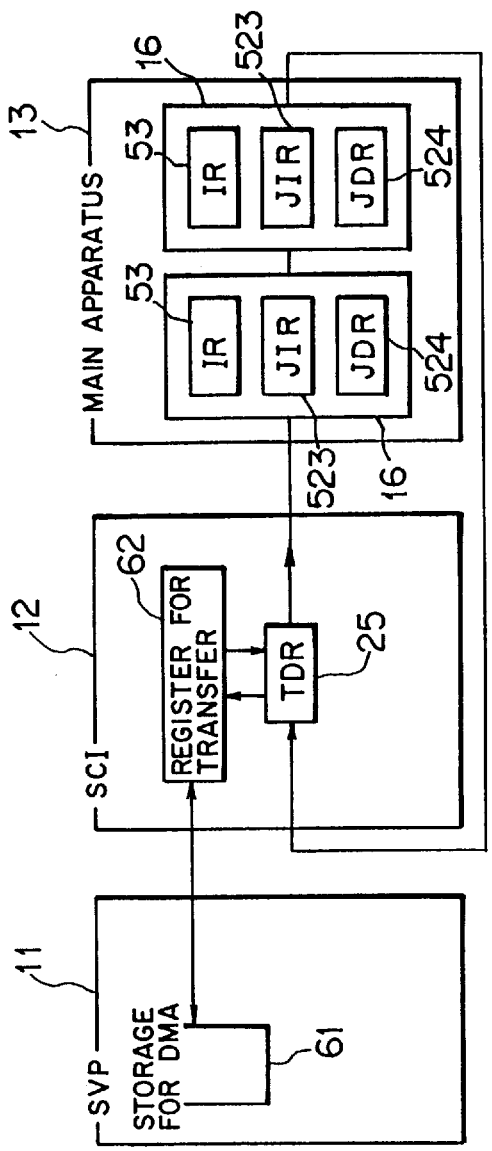
FIG. 15 is a block diagram for illustrating a normal operation when the JTAG command is activated by DMA.

As above, if the JTAG command is activated by DMA, the load data to the object JDR 524 is transferred to a register for transfer 62 within the SCI from a storage for DMA 61 within the SVP 11, then written in the object JDR 524 via the TDR 25 as shown in FIG. 15. On the other hand, the sense data from the object JDR 524 is written in the register for transfer 62 from the TDR 25, then transferred to the storage for DMA 61 within the SVP 11 from the register for transfer 62.

On the normal route indicated by dotted line shown in FIG. 16, it is necessary to set the same command in the IR 53 or the JIR 523 each occasion even if loading to the object JDR 524 or sensing to the object JDR 524 is repeatedly implemented.

For instance, if the JTAG command is issued when history data within the object LSI 15 is read out by the DMA to the SVP 11 or if a lot of data is written from the storage for DMA (a main storage) 61 of the SVP 11 in the object LSI 15, it is necessary to repeat the normal route indicated by dotted line in FIG. 16. However, it would take a considerable time until all processes are completed.

According to this embodiment, switching of a value of the test mode select signal TMS in the UPDATE-DR state (S216) shown in FIG. 19 is implemented with the number counter value BCR mentioned above.

Namely, if the instruction code set in the IR 53 is "51" (JDR SET), the number counter value BCR is subtracted by one each time the state becomes the UPDATE-DR state (S216). If the number counter value BCR after the subtraction is not 0, a value of the test mode select signal TMS is made "1". If the number counter value BCR after the subtraction is 0, a value of the test mode select signal TMS is switched to "0".

In consequence, if the instruction code set in the IR 53 is "51" (JDR SET) and the number counter value BCR is not 0, the state returns from the UPDATE-DR state (S216) to the SELECT-DR-SCAN state (S203). In other words, a route indicated by solid line in FIG. 16 is repeated the number of times designated by DMA. If the number counter value BCR becomes 0, the state normally returns from the UPDATE-DR state (S216) to the RUN-TEST/IDLE state (S202) as indicated by dotted line in FIG. 16.

As above, if the JTAG command is activated by DMA, it is possible to repeat an access (the data shifting operation) according to the JTAG command the number of times of execution of DMA to the JDR 524 while the same JTAG command remains held as it is in the JIR 523.

Therefore, it is unnecessary to set the same instruction in the IR 53 or the JIR 523 every occasion so that a part to be repeated may be reduced from a region indicated by dotted line to a region indicated by solid line. It is thus possible to shorten a time required to read data from the system logical circuit on an object LSI 15 or a time required to write data in the system logical circuit on an object LSI 15, thus largely contribute to an improvement in efficiency of a data writing process or data reading process.

(D) Others

The above embodiment has been described by way of an example in which various numerical values (the number of LSIs, the number of bits of the register, etc.) in FIGS. 5 through 10 or Table 1 are specified, or data loading to the OPSR 34 or data loading from the OPSR 34 is implemented. However, this invention is not limited to the above setting of the numerical values and the like.

Further, the above embodiment has been described by way of an example in which the chip component is an LSI. However, this invention is not limited to this example.

What is claimed is:

1. A processing system, comprising:

a printed circuit board having plural chip components;

a plurality of testing mechanisms respectively disposed in each of the chip components, wherein each testing mechanism is a JTAG circuit having a boundary scan architecture, each of said JTAG circuits comprising:

a boundary scan register to capture and hold a signal appearing at each terminal of the respective chip component;

a JTAG instruction register for storing an instruction to control a system logical circuit;

a JTAG data register for storing data to be written into the system logical circuit or data read out from the system logical circuit;

an instruction register for storing an instruction to designate one register among said data registers;

a data register selecting unit for selecting a register according to the instruction stored in said instruction register; and an output data selecting unit for outputting data from the register selected by said data register selecting unit, wherein each of said boundary scan register, said JTAG instruction register, said JTAG data register and said instruction register is connected like a chain with corresponding registers in the other chip components via said output data selecting unit; and a data storing unit, comprising:

an object chip component set unit for designating an object chip component having a register for data storage;

a data storage for object chip component for storing data to be written into the register of the designated object chip component; and a data control unit for writing the data held in said data storage for object chip component into the register of the designated object chip component.

2. The processing system according to claim 1, wherein if each testing mechanism stores an instruction to be given to a system logical circuit of said chip component;

said data storing unit has a data storage for non-object chip component for storing an instruction to be written into the registers of non-object chip components excepting said object chip component to nullify an operation of said testing mechanisms or said system logical circuits on said non-object chip components; and said data control unit writes the instruction held in said data storage for non-object chip component into the registers of said non-object chip components excepting said object chip component set in said object chip component set unit in the shifting operation.

3. The processing system according to claim 2, wherein said data control unit stops the shifting operation when said data control unit has written data held in said data storage for object chip component into the register of said object chip component set in said object chip component set unit.

4. The processing system according to claim 1, wherein said data control unit writes data read out from the register of said object chip component set in said object chip component set unit into said data storage for object chip component into the shifting operation.

5. The processing system according to claim 2, wherein said data control unit writes data read out from the register of said object chip component set in said object chip component set unit into said data storage for object chip component in the shifting operation.

6. The processing system according to claim 3, wherein said data control unit writes data read out from the register of said object chip component set in said object chip component setting unit into said data storage for object chip component in the shifting operation.

7. The processing system according to claim 4, wherein said data control unit stops the shifting operation when said data control unit has written data read out from the register of said object chip component set in said object chip component set unit into said data storage for object chip component.

8. The processing system according to claim 5, wherein said data control unit stops the shifting operation when said data control unit has written data read out from the register of said object chip component set in said object chip component set unit into said data storage for object chip component.

9. The processing system according to claim 6, wherein said data control unit stops the shifting operation when said data control unit has written data read out from the register of said object chip component set in said object chip component set unit into said data storage for object chip component.

10. The processing system according to claim 1, wherein a serial number given to each of said chip components connected like a chain on said printed circuit board is set as information used to designate said object chip component in said object chip component set unit, and said data control unit has a counter which counts up by one each time data is sent out to one chip component, and sends out data held in said data storage for object chip component in the shifting operation if a count value by said counter coincides with the serial number set in said object chip component set unit.

11. The processing system according to claim 1, wherein said testing mechanism in each of said plural chip components has a bypassing mechanism for sending out data transferred from said testing mechanism in the preceding chip component in the shifting operation to said testing mechanism in the following chip component without passing said data through said registers; and in each of said testing mechanisms on non-object chip components excepting said object chip component, said bypassing mechanism sends out data transferred from said testing mechanism in the preceding chip component in the shifting operation to said testing mechanism in the following chip component without passing said data through said registers.

12. The processing system according to claim 11, wherein said processing system performs a resetting process on said registers when said testing mechanisms in each of said plural chip components is initialized, and sets an instruction to nullify an operation of a system logical circuit on each of said non-object chip components in a register in which an instruction to be given to said system logical circuit on each of said plural chip components is stored among said registers in said resetting process.

* * * * *